(12) United States Patent
Kang et al.

(10) Patent No.: US 11,678,475 B2
(45) Date of Patent: Jun. 13, 2023

(54) STATIC RANDOM ACCESS MEMORY USING VERTICAL TRANSPORT FIELD EFFECT TRANSISTORS

(71) Applicant: INTERNATIONAL BUSINESS MACHINES CORPORATION, Armonk, NY (US)

(72) Inventors: Tsung-Sheng Kang, Ballston Lake, NY (US); Ardasheir Rahman, Schenectady, NY (US); Tao Li, Slingerlands, NY (US); Albert M. Young, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 37 days.

(21) Appl. No.: 17/381,462

(22) Filed: Jul. 21, 2021

(65) Prior Publication Data
US 2023/0027780 A1 Jan. 26, 2023

(51) Int. Cl.
*H01L 27/11* (2006.01)
*H01L 29/78* (2006.01)
(Continued)

(52) U.S. Cl.
CPC ...... *H01L 27/1104* (2013.01); *H01L 23/5286* (2013.01); *H01L 27/092* (2013.01); *H01L 29/7827* (2013.01)

(58) Field of Classification Search
CPC ............. H01L 27/1104; H01L 23/5286; H01L 27/092; H01L 29/7827
(Continued)

(56) References Cited

U.S. PATENT DOCUMENTS 9,318,702 B2 4/2016 Fest et al.
9,553,264 B2 1/2017 Collins et al.
(Continued)

FOREIGN PATENT DOCUMENTS

EP 2973772 B1 11/2017

OTHER PUBLICATIONS

Seung, H. M., Kwon, K. C., Lee, G. S., & Park, J. G., "Flexible conductive-bridging random-access-memory cell vertically stacked with top Ag electrode, PEO, PVK, and bottom Pt electrode", Nanotechnology. Oct. 9, 2014, pp. 1-8.

*Primary Examiner* — Mohammad M Hoque
(74) *Attorney, Agent, or Firm* — Tutunjian & Bitetto, P.C.; Samuel Waldbaum

(57) ABSTRACT

A memory device includes a first field effect transistor (FET) stack on a first bottom source/drain region, which includes a first vertical transport field effect transistor (VTFET) device between a second VTFET device and the first source/drain region, and a second FET stack on a second bottom source/drain region, which includes a third VTFET device between a fourth VTFET device and the bottom source/drain region. The memory device includes a third FET stack on a third bottom source/drain region, which includes a fifth VTFET between a sixth VTFET and the third source/drain region, which is laterally adjacent to the first and second source/drain regions. The memory device includes a first electrical connection interconnecting a gate structure of the third VTFET with a gate structure of the fifth VTFET, and a second electrical connection interconnecting a gate structure of the second VTFET with a gate structure of the sixth VTFET.

20 Claims, 23 Drawing Sheets

(51) Int. Cl.
*H01L 23/528* (2006.01)
*H01L 27/092* (2006.01)

(58) Field of Classification Search
USPC .......................................................... 257/329
See application file for complete search history.

(56) References Cited

U.S. PATENT DOCUMENTS

| | | | |
|---|---|---|---|
| 9,558,809 B1 * | 1/2017 | Liaw | G11C 11/412 |
| 9,620,509 B1 * | 4/2017 | Pao | G11C 11/412 |
| 9,680,743 B2 | 6/2017 | Li et al. | |
| 9,711,511 B1 * | 7/2017 | Lim | H01L 29/1037 |
| 9,831,426 B2 | 11/2017 | Park | |
| 10,043,900 B1 | 8/2018 | Bi et al. | |
| 10,043,972 B2 | 8/2018 | Tseng et al. | |
| 10,083,971 B1 * | 9/2018 | Zang | H01L 27/1104 |
| 10,211,206 B1 * | 2/2019 | Zang | H01L 29/42356 |
| 10,217,674 B1 | 2/2019 | Hook et al. | |
| 10,283,411 B1 | 5/2019 | Hook et al. | |
| 10,297,513 B1 | 5/2019 | Yamashita et al. | |
| 10,312,229 B2 * | 6/2019 | Moroz | H01L 27/1108 |
| 11,114,381 B2 * | 9/2021 | Liebmann | H01L 21/823871 |
| 11,355,397 B2 * | 6/2022 | Sreenivasan | H01L 29/66795 |
| 11,482,279 B2 * | 10/2022 | Zhu | H01L 29/7827 |
| 2011/0249489 A1 * | 10/2011 | Bangsaruntip | B82Y 10/00 |
| | | | 257/E21.409 |
| 2016/0172246 A1 * | 6/2016 | van Dal | H01L 21/02538 |
| | | | 438/268 |
| 2016/0336329 A1 * | 11/2016 | Colinge | H01L 21/26513 |
| 2019/0081049 A1 * | 3/2019 | Zang | H01L 29/0676 |
| 2019/0305218 A1 | 10/2019 | Trinh et al. | |
| 2020/0144330 A1 * | 5/2020 | Majhi | H01L 27/2454 |
| 2021/0366916 A1 * | 11/2021 | Ye | H01L 27/092 |

* cited by examiner

STATIC RANDOM ACCESS MEMORY USING VERTICAL TRANSPORT FIELD EFFECT TRANSISTORS

BACKGROUND

The present invention generally relates to random access memory (RAM) using vertical transport field effect transistors, and more particularly to static random access memory (SRAM) using stacked vertical transport field effect transistors.

SUMMARY

In accordance with an embodiment of the present invention, a memory device is provided. The memory device includes a first field effect transistor (FET) stack on a first bottom source/drain region, wherein the first field effect transistor (FET) stack includes a first vertical transport fin field effect transistor (VTFET) device between a second VTFET device and the first bottom source/drain region, and a second field effect transistor (FET) stack on a second bottom source/drain region, wherein the second field effect transistor (FET) stack includes a third VTFET device between a fourth VTFET device and the second bottom source/drain region. The memory device further includes a third field effect transistor (FET) stacks on a third bottom source/drain region, wherein the third field effect transistor (FET) stack includes a fifth VTFET device between a sixth VTFET device and the third bottom source/drain region, wherein the third bottom source/drain region is laterally adjacent to the first bottom source/drain region and the second bottom source/drain region. The memory device further includes a first electrical connection interconnecting a gate structure of the third VTFET device with a gate structure of the fifth VTFET device, and a second electrical connection interconnecting a gate structure of the second VTFET device with a gate structure of the sixth VTFET device.

In accordance with another embodiment of the present invention, a memory device is provided. The memory device includes a first field effect transistor (FET) stack on a first bottom source/drain region, wherein the first field effect transistor (FET) stack includes a first vertical transport fin field effect transistor (VTFET) device between a second VTFET device and the first bottom source/drain region, and a second field effect transistor (FET) stack on a second bottom source/drain region, wherein the second field effect transistor (FET) stack includes a third VTFET device between a fourth VTFET device and the second bottom source/drain region, wherein the second bottom source/drain region is aligned with the first bottom source/drain region along a long axis. The memory device further includes a third field effect transistor (FET) stack on a third bottom source/drain region, wherein the third field effect transistor (FET) stack includes a fifth VTFET device between a sixth VTFET device and the third bottom source/drain region, wherein the third bottom source/drain region is laterally adjacent to the first bottom source/drain region and the second bottom source/drain region, and the third field effect transistor (FET) stack is positioned between the first field effect transistor (FET) stack and second field effect transistor (FET) stack. The memory device further includes a first electrical connection interconnecting a gate structure of the third VTFET device with a gate structure of the fifth VTFET device, and a second electrical connection interconnecting a gate structure of the second VTFET device with a gate structure of the sixth VTFET device.

In accordance with yet another embodiment of the present invention, a memory device is provided. The memory device includes a first field effect transistor (FET) stack on a first bottom source/drain region, wherein the first field effect transistor (FET) stack includes a first vertical transport fin field effect transistor (VTFET) device between a second VTFET device and the first bottom source/drain region, and a second field effect transistor (FET) stack on a second bottom source/drain region, wherein the second field effect transistor (FET) stack includes a third VTFET device between a fourth VTFET device and the second bottom source/drain region, wherein the second bottom source/drain region is aligned with the first bottom source/drain region along a long axis. The memory device further includes a third field effect transistor (FET) stack on a third bottom source/drain region, wherein the third field effect transistor (FET) stack includes a fifth VTFET device between a sixth VTFET device and the third bottom source/drain region, wherein the third bottom source/drain region is laterally adjacent to the first bottom source/drain region and the second bottom source/drain region, and the third field effect transistor (FET) stack is positioned between the first field effect transistor (FET) stack and second field effect transistor (FET) stack. The memory device further includes a first electrical connection interconnecting a gate structure of the third VTFET device with a gate structure of the fifth VTFET device, and a second electrical connection interconnecting a gate structure of the second VTFET device with a gate structure of the sixth VTFET device. The memory device further includes a ground electrically connected to the first bottom source/drain region and the second bottom source/drain region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate to static random access memory (SRAM) designs using vertical transport fin field effect transistor (VTFET) devices having a shared source/drain region in a stacked structure. An arrangement with a stacked structure and shared source/drains can reduce the footprint size of the SRAM. About a 15% improvement in area scaling can be obtained compared to a conventional VTFET utilizing the same design rule(s).

In various embodiments, the nFETs are on the side that is closer to the Vss, while the pFETs are on the other side that is closer to Vdd. Two channels can be connected in parallel for each fin. There can be 3 epi regions along each fin, with one n-type channel on top of another n-type channel for each fin of a n-MOSFET, and with one p-type channel on top of another p-type channel for each fin of a p-MOSFET. In various embodiments, the position of the PFET-on-PFET stack is not along the same line with nFET stack that is parallel to the power rail. The position of two nFET-on-nFET stacks can be along the line that is parallel to the power rails. N-type device can use Top/Bottom epi as the Source(s) and a shared middle epi as the Drain. P-type device can use a middle shared epi as the Drain and the Top/Bottom epi as the Source(s).

In various embodiments, the word line (WL) connection is the connections of the gates between two NFETs that are not at the same level, for which the extension from a top gate is parallel to the extension of the bottom gate. An L shaped gate connection can be between the n-type and p-type devices in the same stack level.

Exemplary applications/uses to which the present invention can be applied include, but are not limited to: logic device and memory devices.

It is to be understood that aspects of the present invention will be described in terms of a given illustrative architecture; however, other architectures, structures, substrate materials and process features and steps can be varied within the scope of aspects of the present invention.

Figure 1:
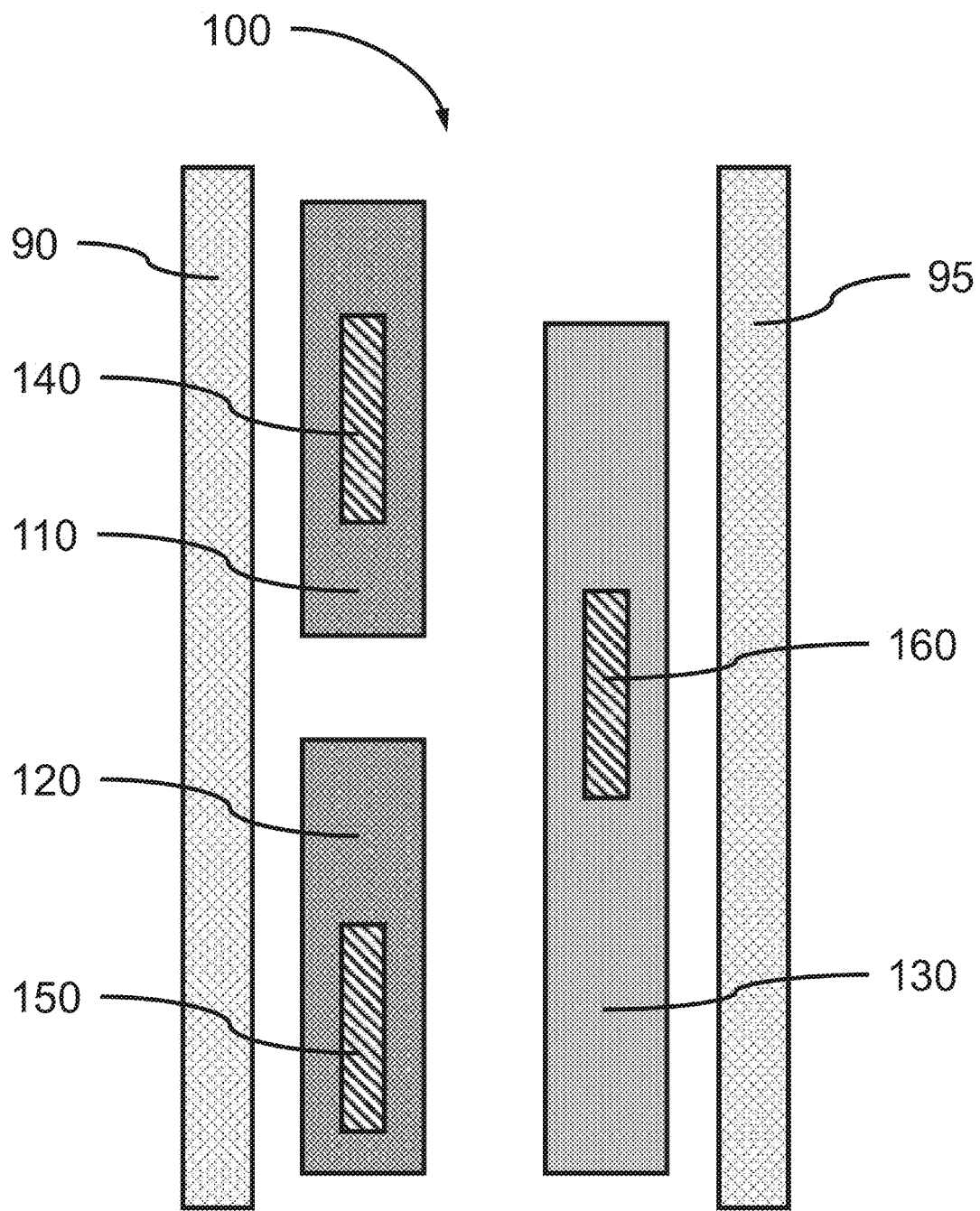
FIG. 1 is a top view showing NFET and PFET stacks with power rails, in accordance with an embodiment of the present invention.

Referring now to the drawings in which like numerals represent the same or similar elements and initially to FIG. 1, a top view of NFET and PFET stacks with power rails is shown, in accordance with an embodiment of the present invention.

In various embodiments, for an SRAM device 100, three field effect transistor (FET) stacks 140, 150, 160 can be formed on three separate bottom source/drain regions 110, 120, 130, where power rails 90, 95 can be positioned on opposite sides of the bottom source/drain regions and FET stacks. Two of the bottom source/drain regions 110, 120, can be doped to form n-type bottom source/drains for NFET devices and one bottom source/drain region 130 can be doped to form a p-type bottom source/drain for PFET devices. The power rail 95 can be configured to provide a voltage, Vdd, to the PFET devices, and the power rail 90 can be configured to provide a voltage, Vss, or as a ground (GND) for the NFET devices. The power rail(s) 90, 95 can be parallel to a long axis of the third field effect transistor (FET) stack The placement and spacing of the bottom source/drain regions 110, 120, 130 and field effect transistor (FET) stacks 140, 150, 160 can be configured such that the interconnections will not intercept each other for the SRAM. The interconnection can be spaced out from each other. An SRAM using shared source/drain regions and stacked devices can provide a reduced footprint size having a first dimension of about 185 nanometers (nm) and a second dimension of 1 CPP to provide an area scaling of 0.85 compared to SRAM with 5GEN XA POR VTFET.

From the top-down view, the center of the fin for field effect transistor (FET) stack 160 can be positioned between 0 to 25 nm from a middle point between the two centers of the field effect transistor (FET) stacks 140, 150, along the direction parallel to the power rails and bottom source/drain regions 110, 120, 130.

Figure 2:
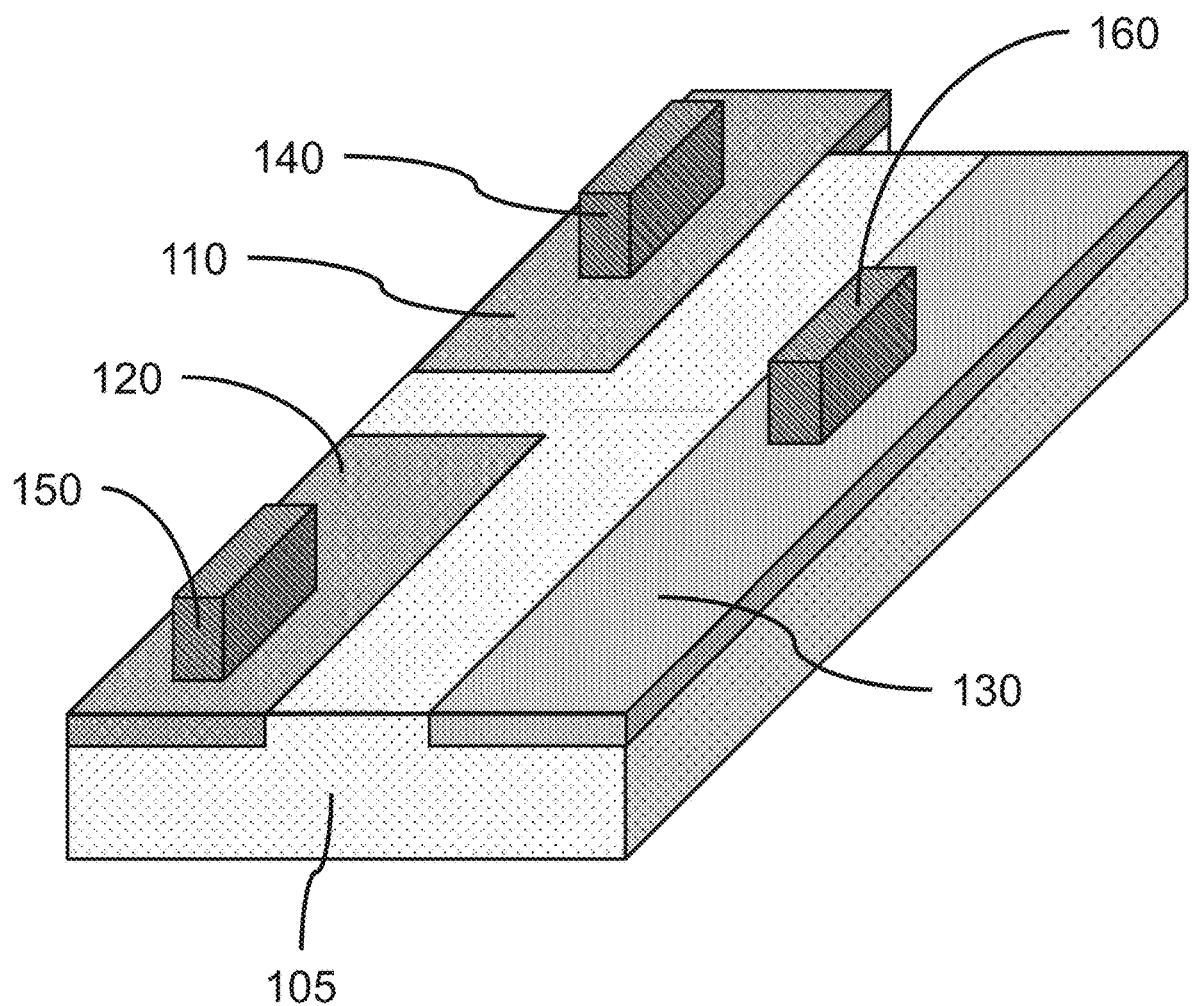
FIG. 2 is an oblique view showing representations of NFET and PFET stacks with bottom source/drains on a substrate, in accordance with an embodiment of the present invention.

FIG. 2 is an oblique view showing representations of NFET and PFET stacks with bottom source/drains on a substrate, in accordance with an embodiment of the present invention.

In various embodiments, a first bottom source/drain 110 and a second bottom source/drain 120 can be formed on a substrate 105, for example, by masking and dopant implantation or epitaxial growth, where the first bottom source/drain 110 and the second bottom source/drain 120 have a first dopant type (e.g., an n-type dopant or p-type dopant). A third bottom source/drain 130 can be formed on a substrate 105, for example, by masking and dopant implantation or epitaxial growth, where the third bottom source/drain 130 can have an opposite dopant type from the first bottom source/drain 110 and the second bottom source/drain 120. In various embodiments, the first bottom source/drain 110 and the second bottom source/drain 120 can be n-doped and the third bottom source/drain 130 can be p-doped. The first bottom source/drain 110 and the second bottom source/drain 120 can be aligned along the same axis. The third bottom source/drain 130 can have a length greater than the combined lengths of the first bottom source/drain 110 and the second bottom source/drain 120. The first bottom source/drain 110 can be separated from the second bottom source/drain 120 by a gap.

In various embodiments, the substrate 105 can be a semiconductor wafer or a semiconductor-on-insulator (SeOI), for example, silicon-on-insulator (SOI) or silicon-germanium-on-insulator (SGOI). In various embodiments, the substrate 105 can be a type IV semiconductor, for example, silicon (Si) or germanium (Ge), a IV-IV compound semiconductor, for example, silicon-germanium (SiGe) or silicon carbide (SiC), or a type III-V semiconductor, for example, gallium arsenide (GaAs) or indium phosphide (InP). In various embodiments, the substrate 105 can be a single crystal semiconductor wafer.

In various embodiments, the first fin field effect transistor device stack 140 can include two n-type VTFETs, and the second fin field effect transistor device stack 150 can include two n-type VTFETs. The third fin field effect transistor device stack 160 can include two p-type VTFETs.

Figure 3:
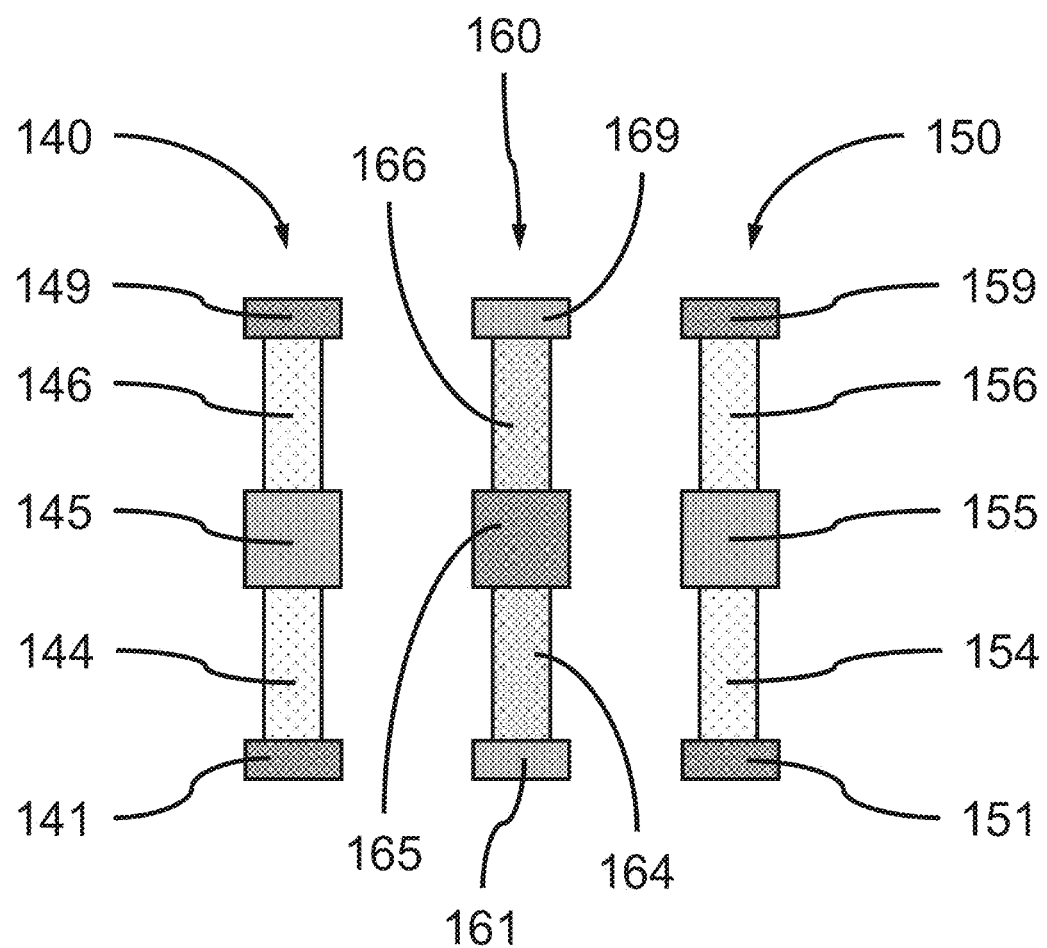
FIG. 3 is an illustration of a cross-section view depicting details of NFET and PFET stacks with an arrangement of top, middle, and bottom source/drains, in accordance with an embodiment of the present invention.

FIG. 3 is an illustration of a cross-section view depicting details of NFET and PFET stacks with an arrangement of top, middle, and bottom source/drains, in accordance with an embodiment of the present invention.

In various embodiments, each of the fin field effect transistor device stacks 140, 150, 160 can include a bottom source/drain region 141, 151, 161, a middle source/drain region 145, 155, 165, and a top source/drain region 149, 159, 169. A lower fin 144, 154, 164 can be between the bottom source/drain region 141, 151, 161 and the middle source/drain region 145, 155, 165. An upper fin 146, 156, 166 can be between the middle source/drain region 145, 155, 165 and the top source/drain region 149, 159, 169.

In various embodiments, the bottom source/drain regions 141, 151, 161 can be at a substrate level. The lower fins 144, 154, 164 can be at a first level above the bottom source/drain regions and substrate. The upper fins 146, 156, 166 can be at a second level above the bottom source/drain regions and substrate. The middle source/drain regions 145, 155, 165 can be at an intermediate level between the lower fins 144, 154, 164 and upper fins 146, 156, 166. The top source/drain regions 149, 159, 169 can be at a third level above the bottom source/drain regions and substrate.

In various embodiments, the fin field effect transistor device stacks 140, 150, 160 can be formed by additive processes involving epitaxial growth of subsequent layers upon lower layers, and masking and etching to form the source/drain regions and intervening fins through a patterning process.

In various embodiments, the fin field effect transistor device stacks 140, 150, 160 can be formed by a subtractive patterning process, where a plurality of layers having predetermined dopant types and doping concentrations can be formed on the substrate 105, for example, by epitaxial growth, and portions of the layers removed through masking and etching, for example, by a directional reactive ion etching (RIE). While the bottom source/drain regions 141, 151, 161, middle source/drain regions 145, 155, 165, and a top source/drain regions 149, 159, 169, are shown as wider than the lower fins 144, 154, 164 and upper fins 146, 156, 166, this is for illustrative purposes only to distinguish the layers, and the bottom source/drain regions 141, 151, 161, middle source/drain regions 145, 155, 165, and a top source/drain regions 149, 159, 169, also could have the same width as the lower fins 144, 154, 164 and upper fins 146, 156, 166.

In various embodiments, the middle source/drain region 165 of the PFET stack 160 can be configured as a source, and the middle source/drain regions 145, 155 of the NFET stacks 140, 150 can be configured as drains. The middle source/drain region 145 is shared by lower NFET device (N3) 152 and upper NFET device (N4) 158. The middle source/drain region 155 is shared by lower NFET device (N1) 142 and upper NFET device (N2) 148. The middle source/drain region 165 is shared by upper PFET device (P1) 168 and lower PFET device (P2) 162.

Figure 4:
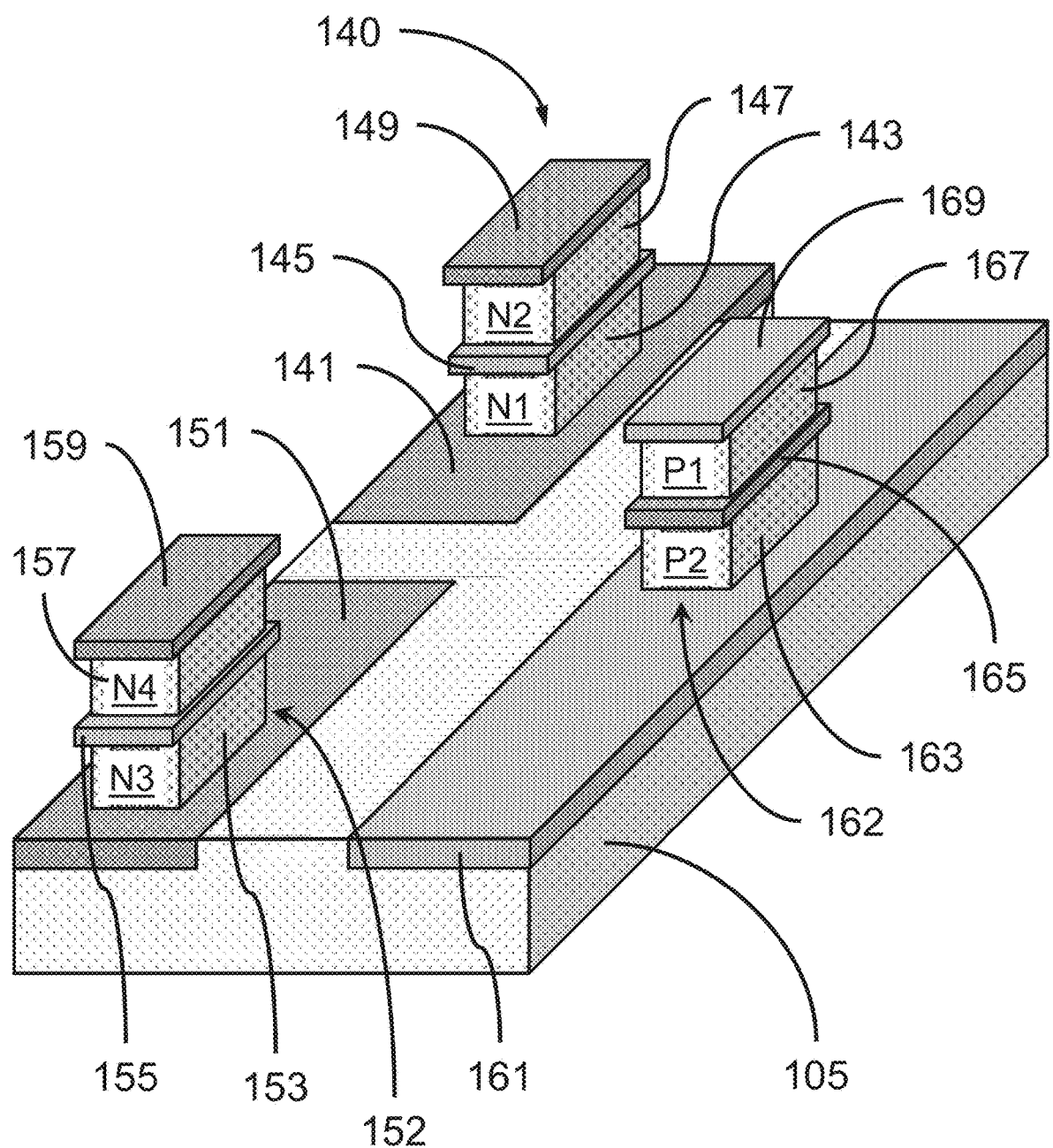
FIG. 4 is an oblique view showing NFET and PFET stacks with bottom source/drains on a substrate, in accordance with an embodiment of the present invention.

FIG. 4 is an oblique view showing NFET and PFET stacks with bottom source/drains on a substrate, in accordance with an embodiment of the present invention.

In various embodiments, lower gate structure 143 can be formed on the lower fin 144 of the VTFET stack 140, and an upper gate structure 147 can be formed on the upper fin 146 of the VTFET stack 140. In various embodiments, lower gate structure 153 can be formed on the lower fin 154 of the VTFET stack 150, and an upper gate structure 157 can be formed on the upper fin 156 of the VTFET stack 150. In various embodiments, lower gate structure 163 can be formed on the lower fin 164 of the VTFET stack 160, and an upper gate structure 167 can be formed on the upper fin 166 of the VTFET stack 160. Each gate structure 143, 147, 153, 157, 163, 167 can include a gate dielectric layer on the fin, a work function material layer on the gate dielectric layer, and a conductive gate electrode on the work function material layer.

Figure 5:
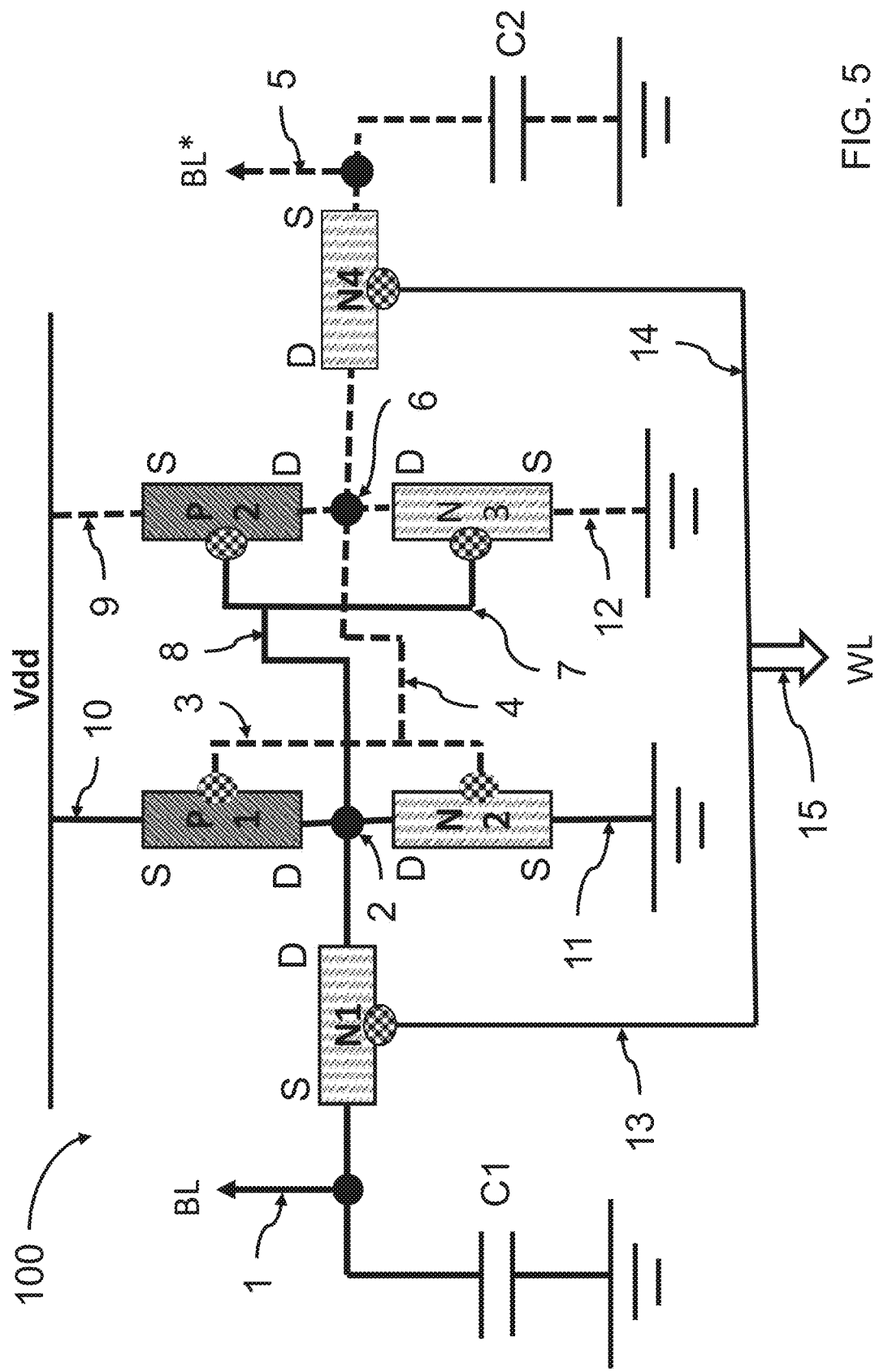
FIG. 5 is a circuit diagram showing electrical connections of the NFET and PFET stacks for an SRAM, in accordance with an embodiment of the present invention.

FIG. 5 is a circuit diagram showing electrical connections of the NFET and PFET stacks for an SRAM, in accordance with an embodiment of the present invention.

In various embodiments, electrical connections can be made between the different source/drain regions and gate structures of the FETs and the power rails, bit lines (BL), and word lines (WL) for the memory device, where the memory device can be a static random access memory.

In various embodiments, the components of an SRAM on the same or different levels can be interconnected by vias and/or conductive lines, where the vias and conductive lines can be made of metal(s) and/or metal compounds.

In various embodiments, the gate structure 163 (connections to gate structures have been indicated by the checkered ellipse) of a lower PFET device (P2) 162 can be electrically connected to the gate structure 153 of a lower PFET device 152 by electrical connection 7. The gate structure 163 of a lower PFET device (P2) 162 can be electrically connected to the top source/drain 169 of the upper PFET (P1) 168 by electrical connection 8, which can include a via between different levels.

In various embodiments, the gate structure 147 of a upper NFET device (N2) 148 can be electrically connected to the gate structure 167 of upper PFET device (P1) 168 by electrical connection 3. The gate structure 143 of a lower NFET device (N1) 142 can be electrically connected to the gate structure 157 of a upper NFET device (N4) 158 by electrical connection 14, which can include a via between different levels.

In various embodiments, the gate structure 147 of a upper NFET device (N2) 148 and the gate structure 167 of upper PFET device (P1) 168 can be electrically connected to the bottom source/drain 161 by electrical connection 4.

In various embodiments, the middle source/drain 145 of NFET stack 140, including lower NFET device (N1) 142 and upper NFET device (N2) 148, can be electrically connected to the top source/drain 169 of upper PFET device (P1) 168 of PFET stack 160 by electrical connection 2, which can include a via between levels.

In various embodiments, the middle source/drain 155 of NFET stack 150, including lower NFET device (N3) 152 and upper NFET device (N4) 158, can be electrically connected to the bottom source/drain 161 of lower PFET device (P2) 162 of PFET stack 160 by electrical connection 6, which can include a via between levels. A Bit Line (BL) 1 can be formed to the bottom source/drain 141 of the lower NFET device (N1) 142 of the NFET stack 140.

In various embodiments, an electrical connection 5 can be formed to the top source/drain 159 of the NFET stack 150. The electrical connection 5 can be a Bit Line star (BL*), which does not connect to Bit Line (BL) 1. Bit Line star (BL*) can be a second Bit Line that connects to a higher device level that can be closer to the outside world.

In various embodiments, an electrical connection 11, can be formed to the top source/drain 149 of upper NFET (N2) 148, where electrical connection 11 can include a via.

In various embodiments, an electrical connection 12, can be formed to the bottom source/drain 151 of lower NFET (N3) 152 where electrical connection 12 can include a via to a different level. The Bit line is connected to a source and drain, whereas the word line is connect to a gate. A Word line can connect to more than single FET's gate, where the FETs all share the same voltage, since they are connected. A Bit line can connect to a single FET's source/drain, and only reads out that single device. The voltage range is dependent on the device characteristics.

In various embodiments, a Ground line (GND) 90 can be formed connecting electrical connection 11 and electrical connection 12, which grounds the connected components.

In various embodiments, a Voltage line (Vdd) 95 can be formed connecting to electrical connection(s) 9&10 through electrical connection 16, which can be a via. The Voltage line (Vdd) can be maintained at a predetermined positive or negative voltage.

In various embodiments, a capacitor, C1, can be electrically coupled between a ground (GND) connection and electrical connection 1 to the Bit Line (BL). A capacitor, C2, can be electrically coupled between a ground (GND) connection and electrical connection 5 to the Bit Line star (BL*). The capacitors can be used as a device to store the electricity and can also be used to rectify the current. It can be a MIM or MOS capacitor. The capacitors are on the other end of the electrical connections 1 and 5, so are physically closer to the surface of the board.

It should be noted that the reference numbers for the connections illustrated in FIG. 5 are also used in the oblique views to identify the physical connections, as discussed below.

Figure 6:
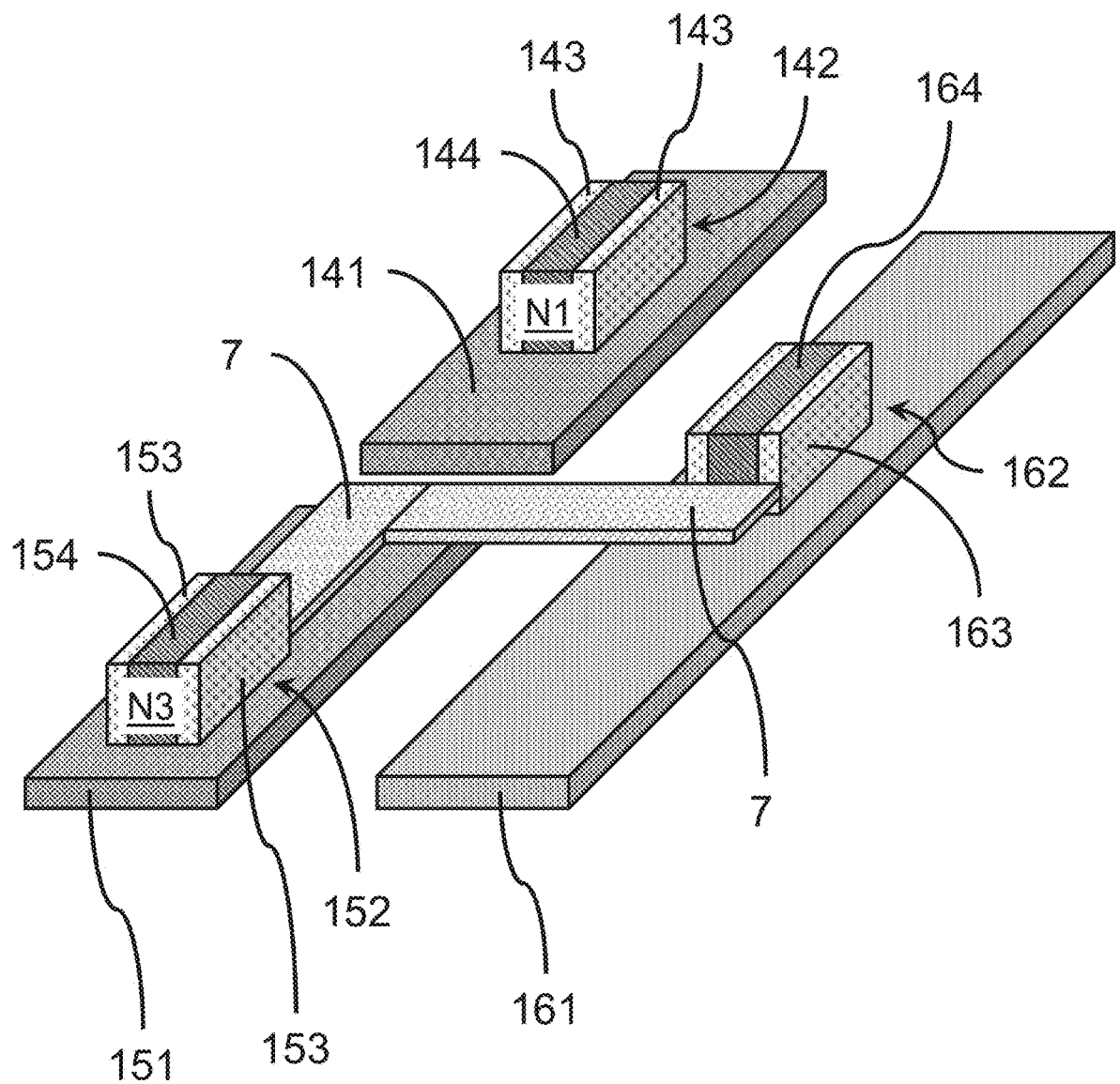
FIG. 6 is an oblique view showing fabrication of electrical connections for the lower portions of the NFET and PFET stacks on bottom source/drains, in accordance with an embodiment of the present invention.

FIG. 6 is an oblique view showing fabrication of electrical connections for the lower portions of the NFET and PFET stacks on bottom source/drains, in accordance with an embodiment of the present invention.

In various embodiments, the gate structure 163 of a lower PFET device 162 can be electrically connected to the gate structure 153 of a lower NFET device 152 by electrical connection 7. The electrical connection 7 can be formed at the same level as the lower NFET device 152 and lower PFET device 162, where electrical connection 7 can have an "L" shape on the same level. The connection 7 can include a conductive line parallel with the plane of the substrate, and may include a via where transitions to higher or lower levels/devices are made.

In various embodiments, the electrical connections can be formed by a damascene fabrication process, including forming a trench in a dielectric material layer on the lower NFET and lower PFET device, and filling the trench with one of more conductive materials (e.g., dual damascene). In various embodiments, the electrical connections can be formed by a conductive material, for example, a metal, including, but not limited to, copper (Cu), tungsten (W), aluminum (Al), molybdenum (Mo), Gold (Au), Nickle (Ni), Titanium (Ti), and combinations thereof. The electrical connections may include more than one material, where an outer material can form a barrier lay to prevent diffusion of a metal into neighboring dielectric material. In various embodiments, the electrical connections may include a silicide material at an interface.

Figure 7:
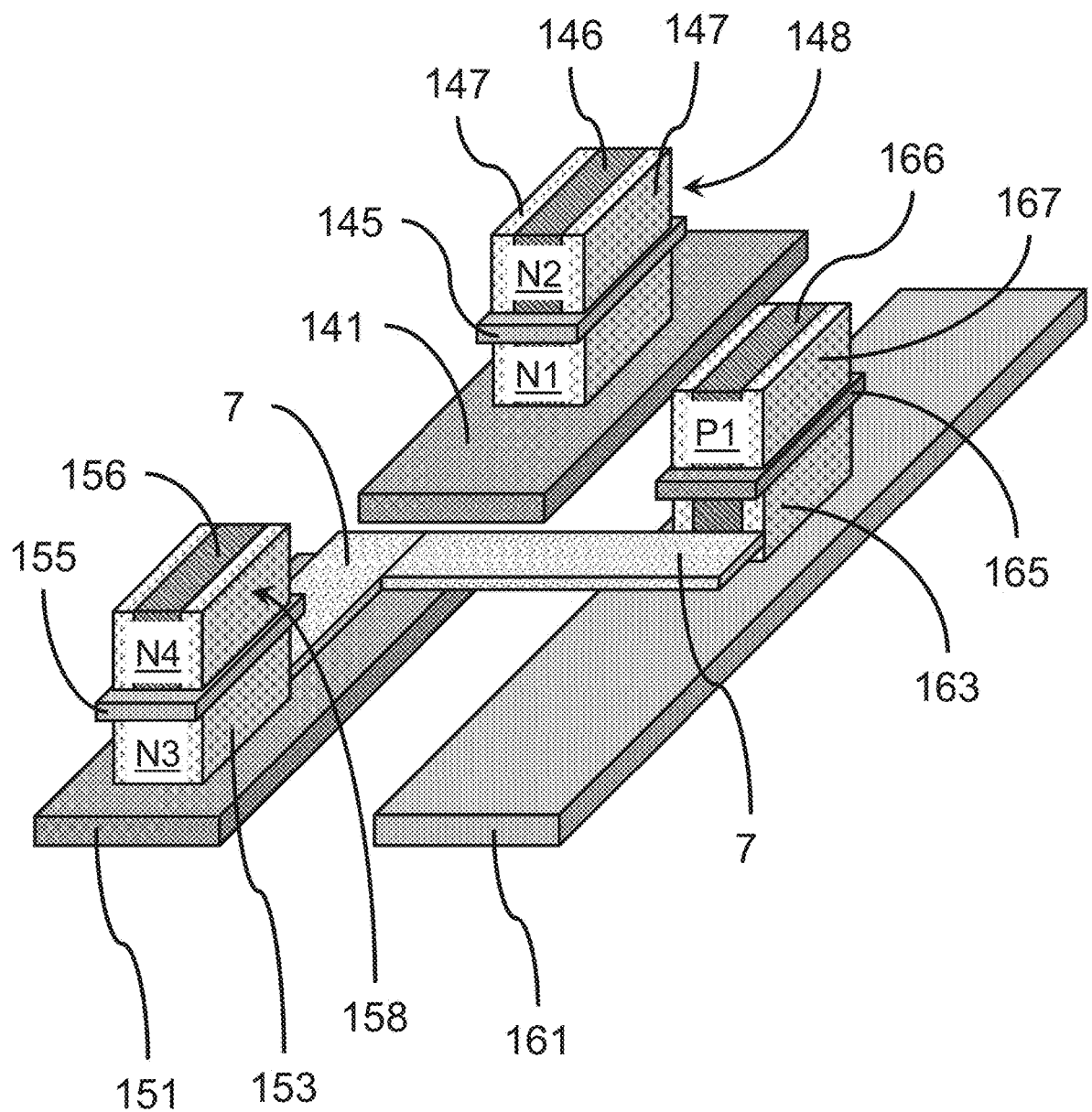
FIG. 7 is an oblique view showing fabrication of the upper portions of the NFET and PFET stacks on bottom source/drains, in accordance with an embodiment of the present invention.

FIG. 7 is an oblique view showing fabrication of the upper portions of the NFET and PFET stacks on bottom source/drains, in accordance with an embodiment of the present invention.

In various embodiments, the middle source/drain regions 145, 155, 165 can be formed on the lower level NFET and PFET device 142, 152, 162, where the middle source/drain regions 145, 155, 165 can be formed by epitaxial growth of a suitably doped semiconductor material on each of the lower semiconductor fins 144, 154, 164. The upper level NFET and PFET device 148, 158, 168 can be formed by epitaxial growth of a semiconductor material on the underlying middle source/drain regions 145, 155, 165. The upper semiconductor fins 146, 156, 166 and middle source/drain regions 145, 155, 165 may be formed by masking and etching semiconductor material to pattern the layers.

In various embodiments, gate structures can be formed on each of the lower level fins 141, 151, 161, and each of the upper level fins 146, 156, 166. Each of the gate structures 143, 153, 163, 147, 157, 167 can include a gate dielectric layer on the fin and a gate conductor on the gate dielectric layer. A work function material can be between the gate dielectric layer and a gate electrode to form the gate conductor.

Figure 8:
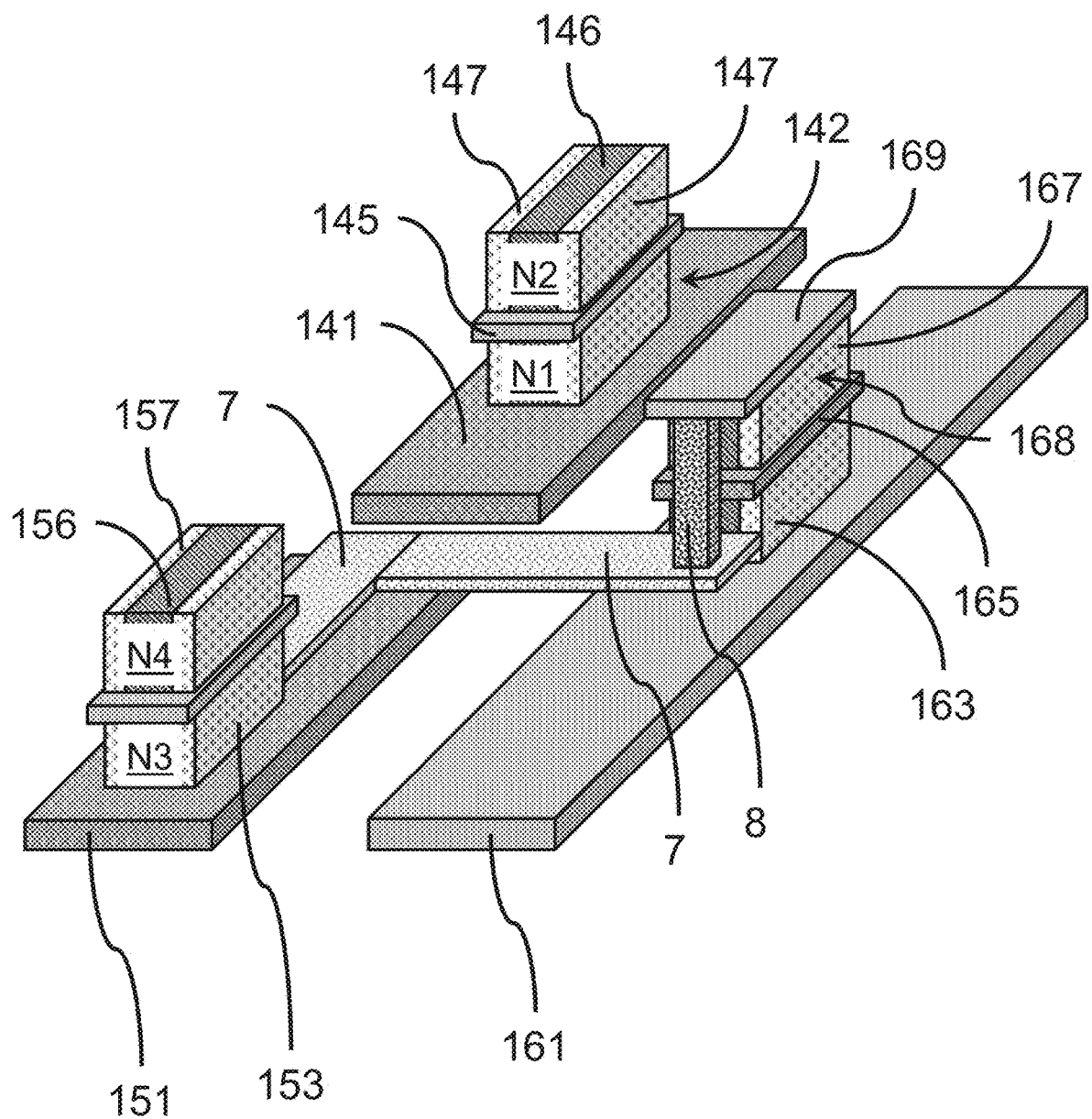
FIG. 8 is an oblique view showing fabrication of electrical connections between upper and lower portions of the NFET and PFET stacks on bottom source/drains, in accordance with an embodiment of the present invention.

FIG. 8 is an oblique view showing fabrication of electrical connections between upper and lower portions of the NFET and PFET stacks on bottom source/drains, in accordance with an embodiment of the present invention.

In various embodiments, the gate structure 163 of a lower PFET device 162 can be electrically connected to the top source/drain 169 of the upper PFET 168 by electrical connection 8, which can include a via between different levels. Electrical connection 8 can be electrically connected to electrical connection 7.

Figure 9:
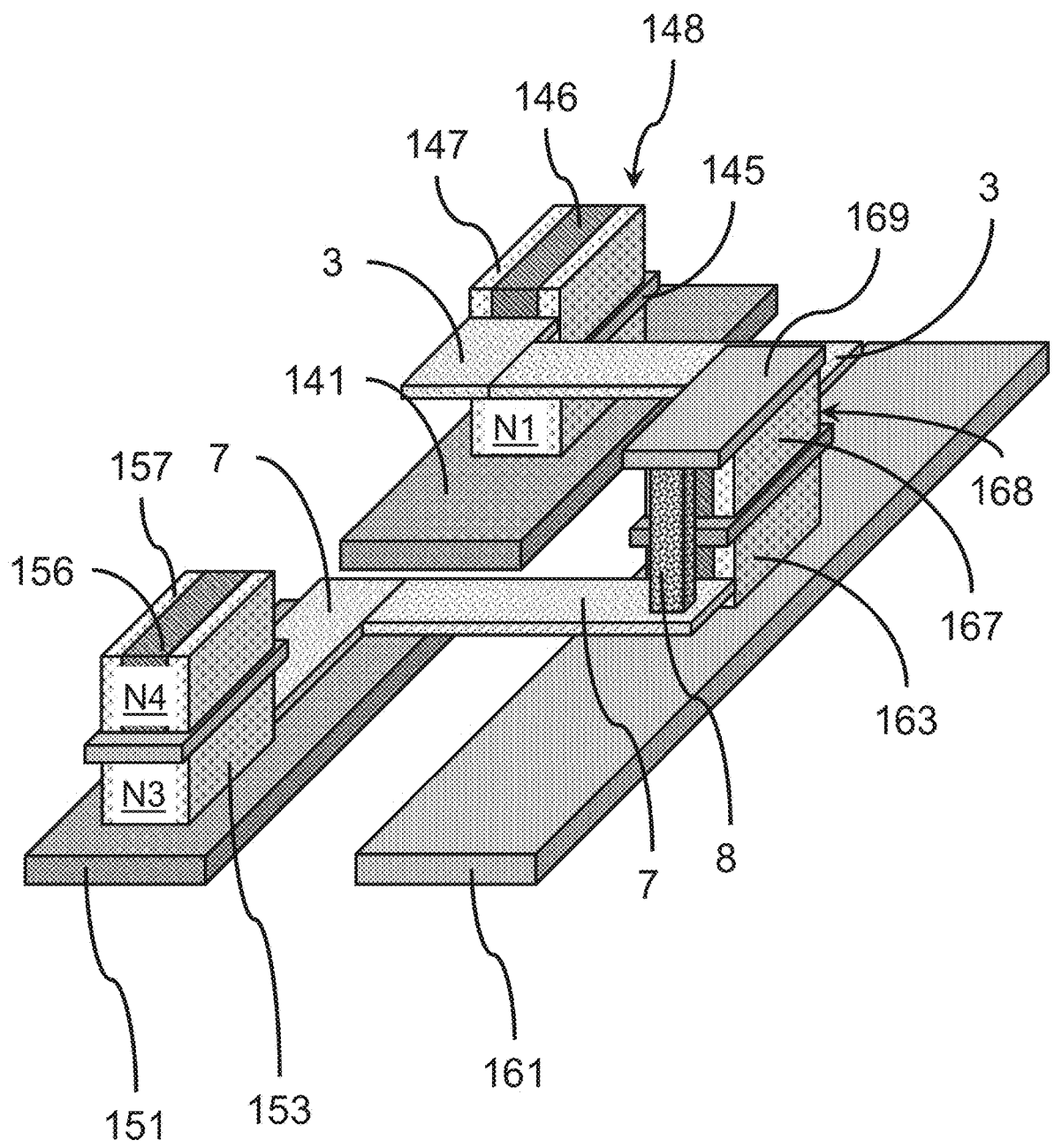
FIG. 9 is an oblique view showing fabrication of electrical connections for the upper portions of the NFET and PFET stacks, in accordance with an embodiment of the present invention.

FIG. 9 is an oblique view showing fabrication of electrical connections for the upper portions of the NFET and PFET stacks, in accordance with an embodiment of the present invention.

In various embodiments, the gate structure 147 of a upper NFET device (N2) 148 can be electrically connected to the gate structure 167 of upper PFET device (P1) 168 by electrical connection 3. The electrical connection 3 can be at the same level as upper NFET device (N2) 148 and upper PFET device (P1) 168. The electrical connection 3 can have an "L" shape on the same level.

Figure 10:
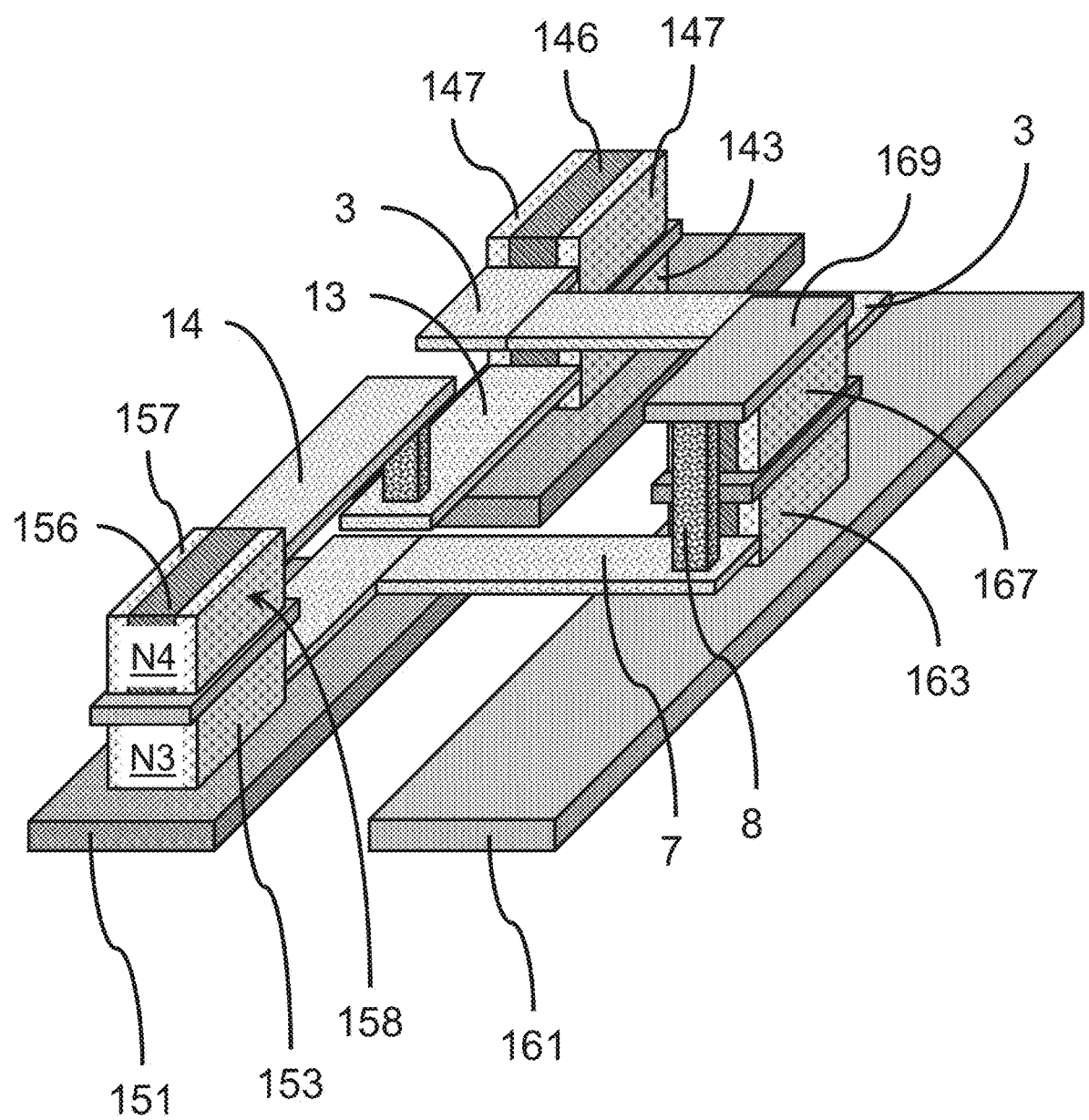
FIG. 10 is an oblique view showing fabrication of electrical connections between upper and lower portions of the NFET and PFET stacks, in accordance with an embodiment of the present invention.

FIG. 10 is an oblique view showing fabrication of electrical connections between upper and lower portions of the NFET and PFET stacks, in accordance with an embodiment of the present invention.

The gate structure 143 of a lower NFET device (N1) 142 can be electrically connected to the gate structure 157 of a upper NFET device (N4) 158 by electrical connection 14, which can include a via between different levels.

Figure 11:
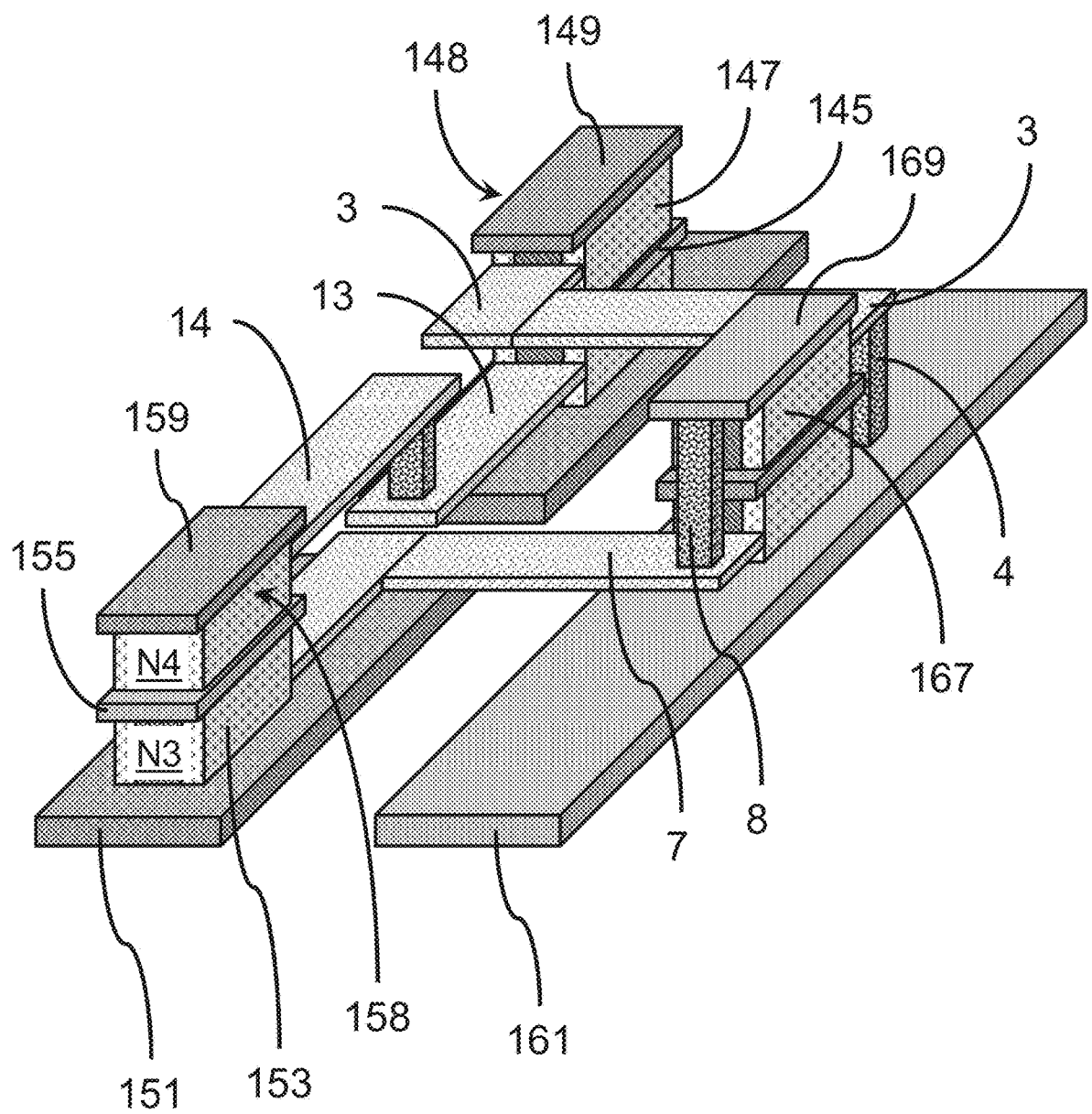
FIG. 11 is an oblique view showing fabrication of electrical connections between portions of the NFET and PFET stacks and the bottom source/drains, in accordance with an embodiment of the present invention.

FIG. 11 is an oblique view showing fabrication of electrical connections between portions of the NFET and PFET stacks and the bottom source/drains, in accordance with an embodiment of the present invention.

In various embodiments, the gate structure 147 of a upper NFET device (N2) 148 and the gate structure 167 of upper PFET device (P1) 168 can be electrically connected to the bottom source/drain 161 by electrical connection 4.

Figure 12:
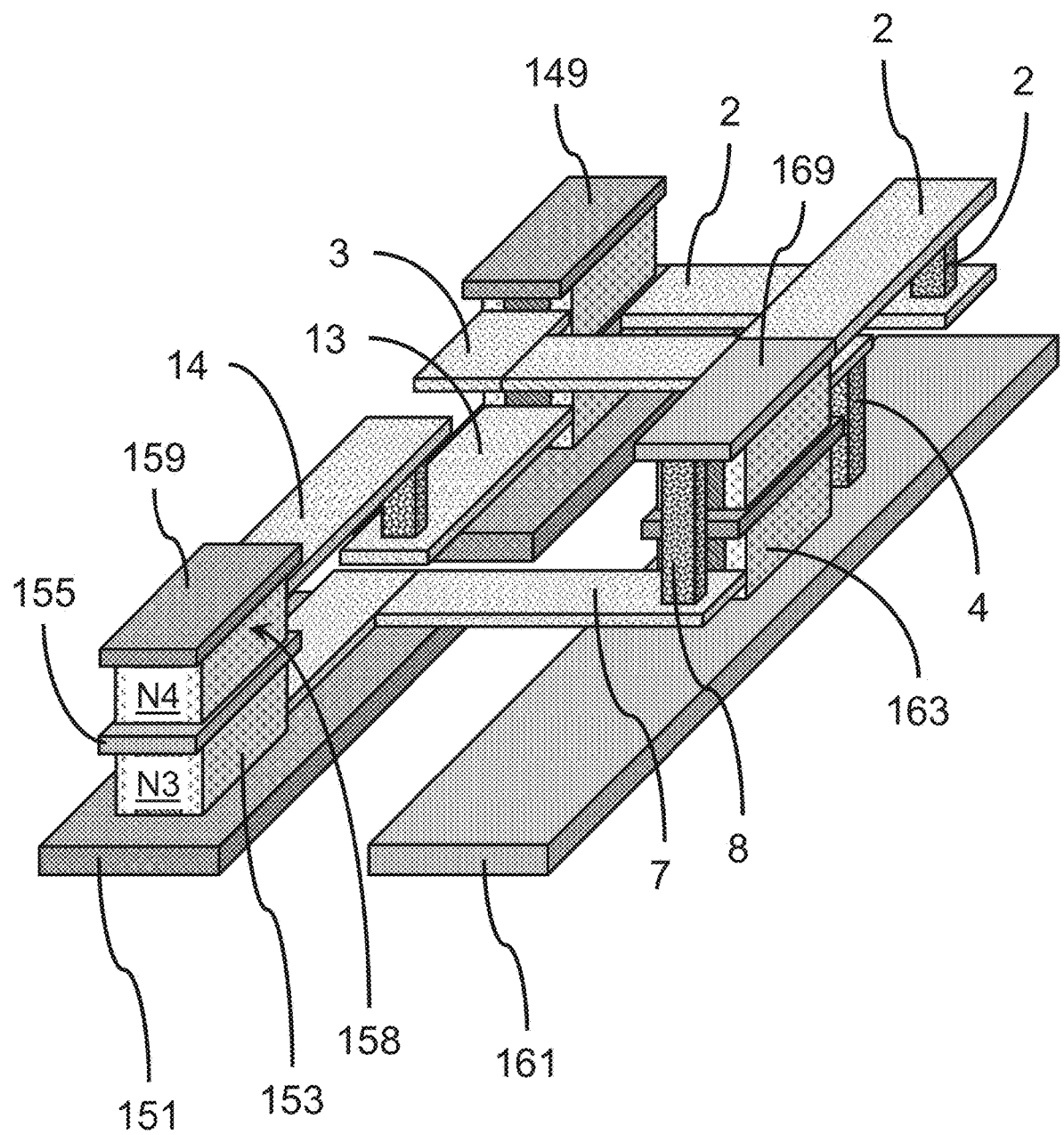
FIG. 12 is an oblique view showing fabrication of electrical connections between upper and middle portions of the NFET and PFET stacks, in accordance with an embodiment of the present invention.

FIG. 12 is an oblique view showing fabrication of electrical connections between upper and middle portions of the NFET and PFET stacks, in accordance with an embodiment of the present invention.

In various embodiments, the middle source/drain 145 of NFET stack 140, including lower NFET device (N1) 142 and upper NFET device (N2) 148, can be electrically connected to the top source/drain 169 of upper PFET device (P1) 168 of PFET stack 160 by electrical connection 2, which can include a via between levels. The source/drains of lower NFET device (N1) 142 and upper NFET device (N2) 148 can be interconnected with the source/drain 169 of upper PFET device (P1) 168 by electrical connection 2. Electrical connection 2 can have an "L" shape on two different levels.

Figure 13:
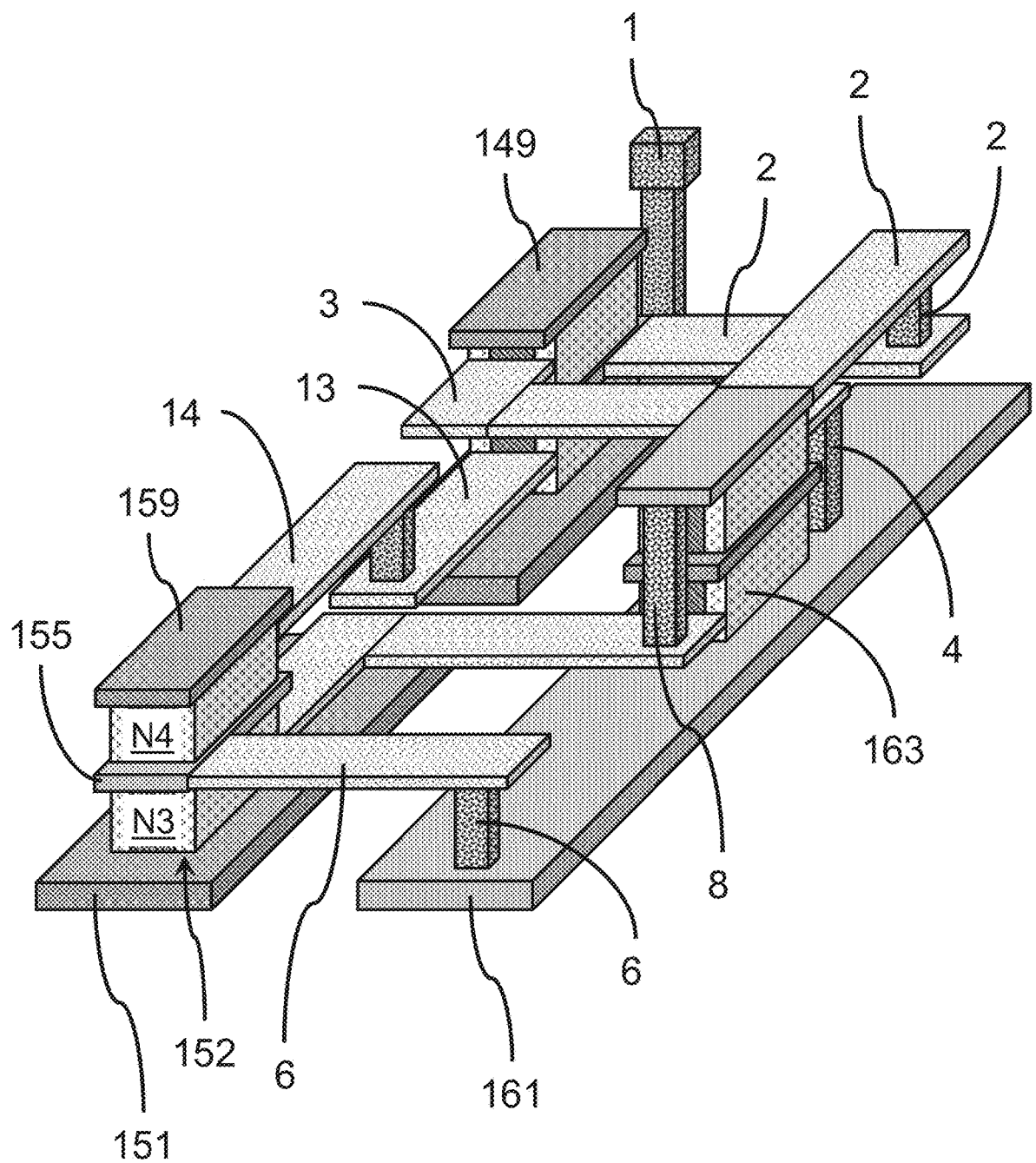
FIG. 13 is an oblique view showing fabrication of electrical connections between portions of the NFET and PFET stacks with the bottom source/drains, in accordance with an embodiment of the present invention.

FIG. 13 is an oblique view showing fabrication of electrical connections between portions of the NFET and PFET stacks with the bottom source/drains, in accordance with an embodiment of the present invention.

In various embodiments, the middle source/drain 155 of NFET stack 150, including lower NFET device (N3) 152 and upper NFET device (N4) 158, can be electrically connected to the bottom source/drain 161 of lower PFET device (P2) 162 of PFET stack 160 by electrical connection 6, which can include a via between levels. A Bit Line (BL) 1 can be formed to the bottom source/drain 141 of the lower NFET device (N1) 142 of the NFET stack 140. The electrical connection 6 can interconnect the source/drains of lower NFET device (N3) 152 and upper NFET device (N4) 158 with the bottom source/drain 161 of lower PFET device (P2) 162.

Figure 14:
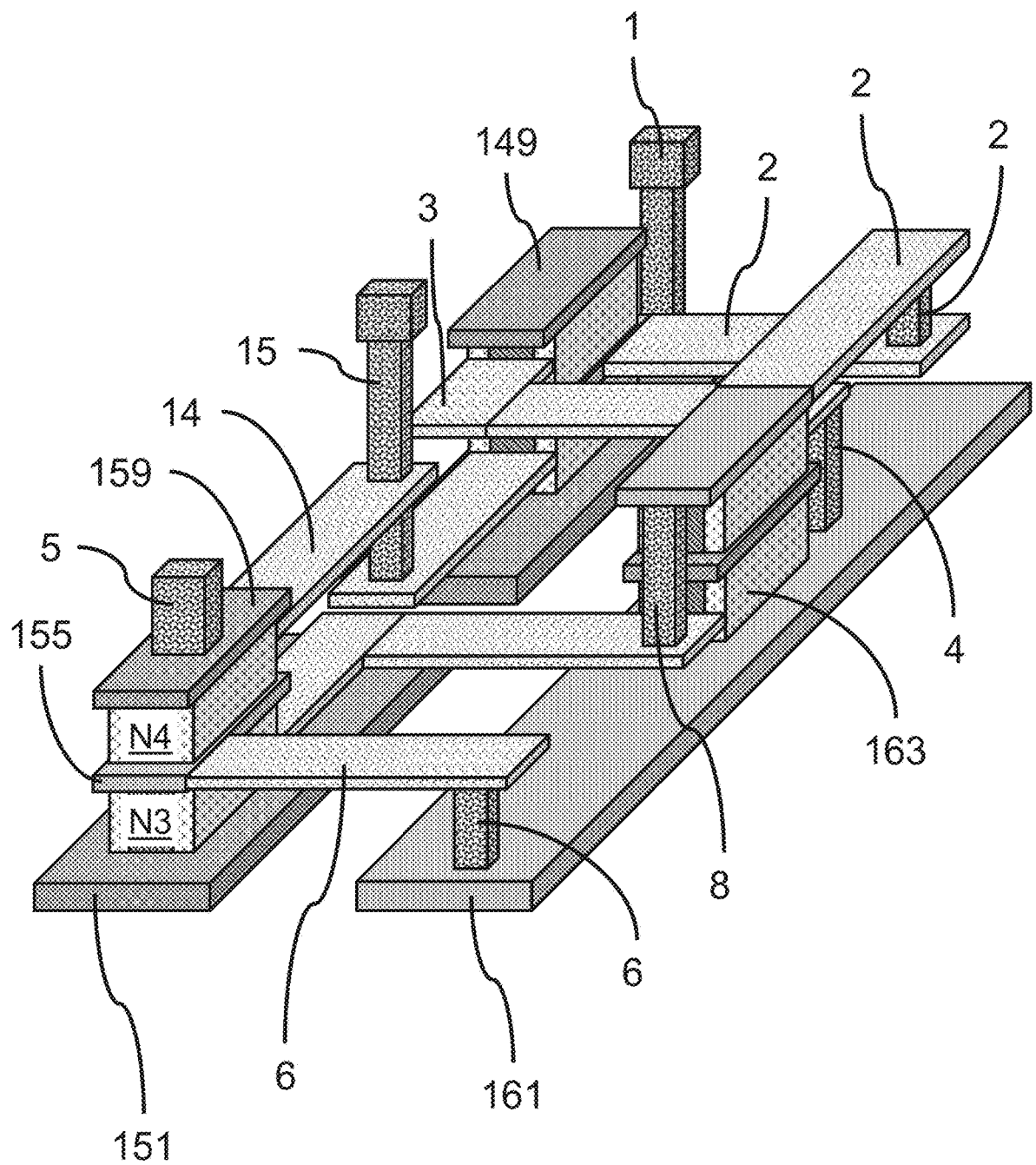
FIG. 14 is an oblique view showing fabrication of electrical connections to an upper portion of the NFET stack, in accordance with an embodiment of the present invention.

FIG. 14 is an oblique view showing fabrication of electrical connections to an upper portion of the NFET stack, in accordance with an embodiment of the present invention.

In various embodiments, an electrical connection 5 can be formed to the top source/drain 159 of the NFET stack 150. The electrical connection 5 can be a Bit Line star (BL*), which is different from Bit Line (BL) 1. Bit Line star (BL*) can connect to higher level circuitry.

In various embodiments, an electrical connection 15 can be formed to electrical connection 14 connecting the gate structure 143 of a lower NFET device (N1) 142 with the gate structure 157 of a upper NFET device (N4) 158. The electrical connection 15 can be a Word Line (WL). Word Line (WL) can connect to higher level circuitry.

Figure 15:
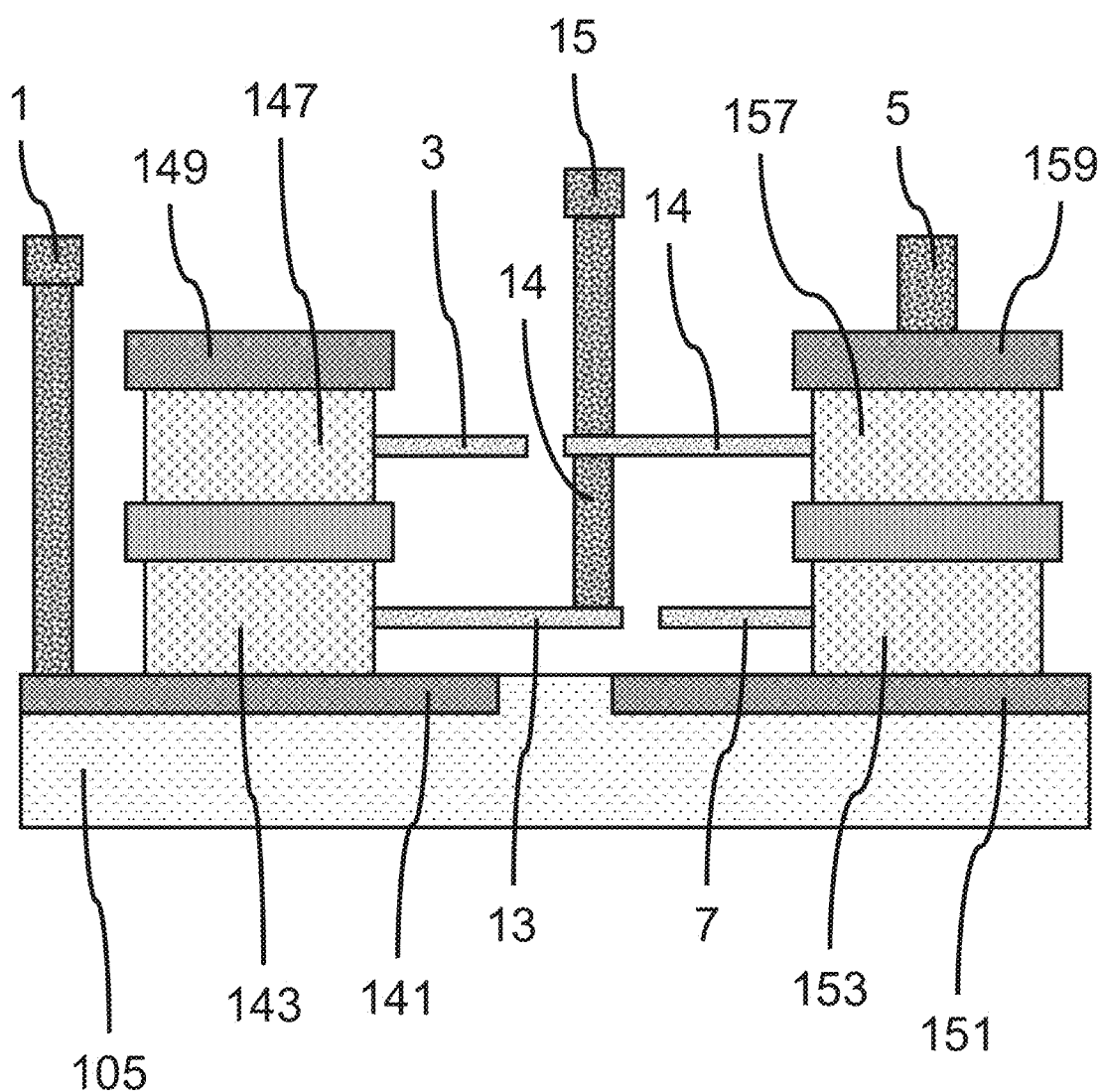
FIG. 15 is a cross-sectional side view showing the horizontal placement and vertical transitions of electrical connections between the two NFET stacks, in accordance with an embodiment of the present invention.

FIG. 15 is a cross-sectional side view showing the horizontal placement and vertical transitions of electrical connections between the two NFET stacks, in accordance with an embodiment of the present invention.

In various embodiments, the electrical connection 14 can include a via between conductive lines on two different levels for the gate structure 143 of a lower NFET device (N1) 142 and the gate structure 157 of a upper NFET device (N4) 158. The electrical connection 3 can be at the same level as the portion of electrical connection 14 connected to the gate structure 157 of a upper NFET device (N4) 158, and electrical connection 7 can be at the same level as the portion of electrical connection 14 connected to the gate structure 143 of a lower NFET device (N1) 142. Electrical connection 3 can be separated from electrical connection 14 by a gap that can be filed by a dielectric material, for example, an inter layer dielectric (ILD) layer. Electrical connection 7 can be separated from electrical connection 14 by a gap that can be filed by a dielectric material, for example, an interlayer dielectric (ILD) layer.

In various embodiments, the dielectric material can be a low-k dielectric material, silicon oxide (SiO$_x$), silicon nitride (SiN$_x$), or combinations thereof. The stoichiometry of the compound materials can vary from the stoichiometric compound, for example, silicon dioxide SiO$_2$ or silicon nitride (Si$_3$N$_4$).

Figure 16:
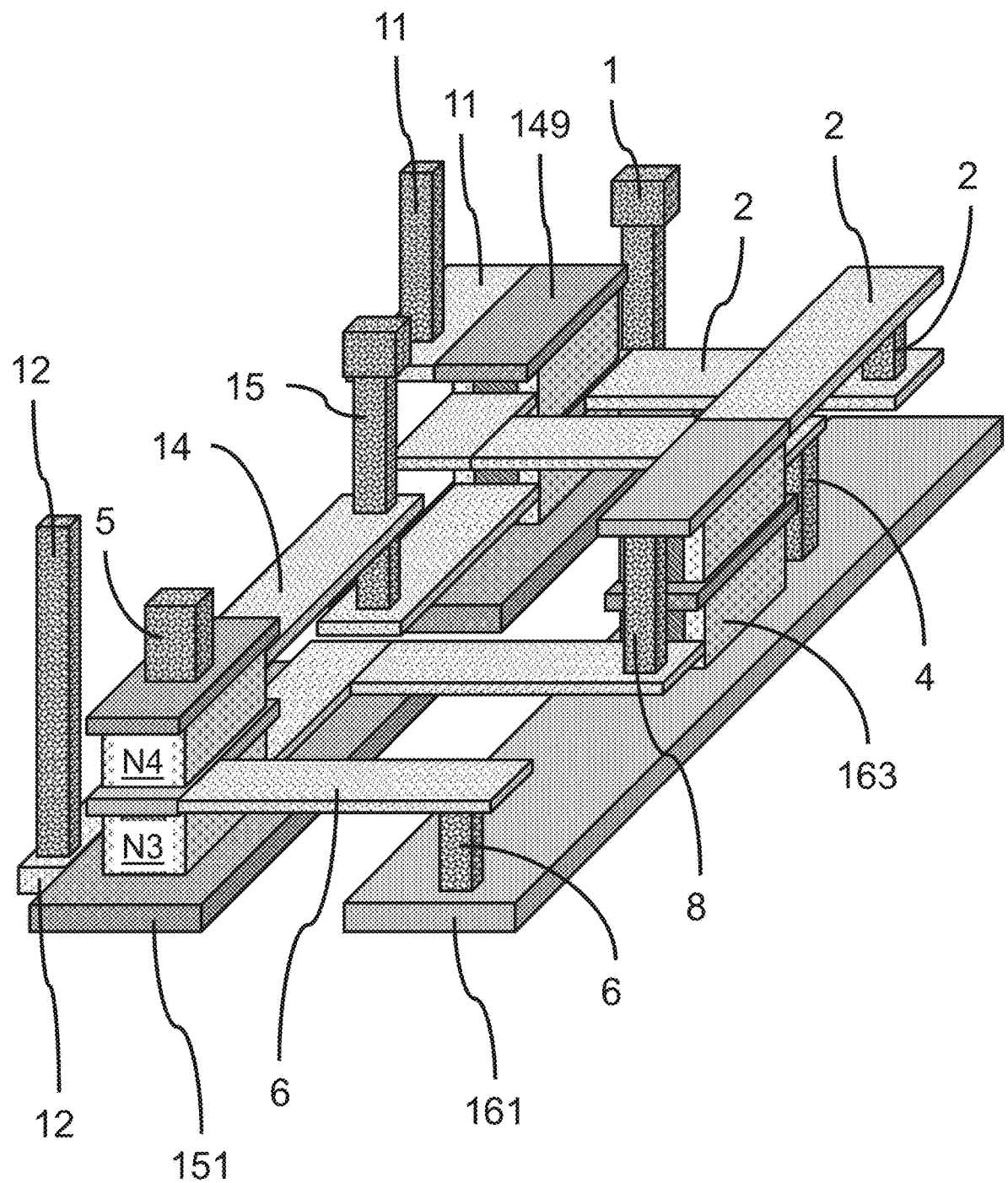
FIG. 16 is an oblique view showing fabrication of electrical connections to the top and bottom source/drains of the NFETS, in accordance with an embodiment of the present invention.

FIG. 16 is an oblique view showing fabrication of electrical connections to the top and bottom source/drains of the NFETS, in accordance with an embodiment of the present invention.

In various embodiments, an electrical connection 12, can be formed to the bottom source/drain 151 of lower NFET (N3) 152, where electrical connection 12 can include a via.

Figure 17:
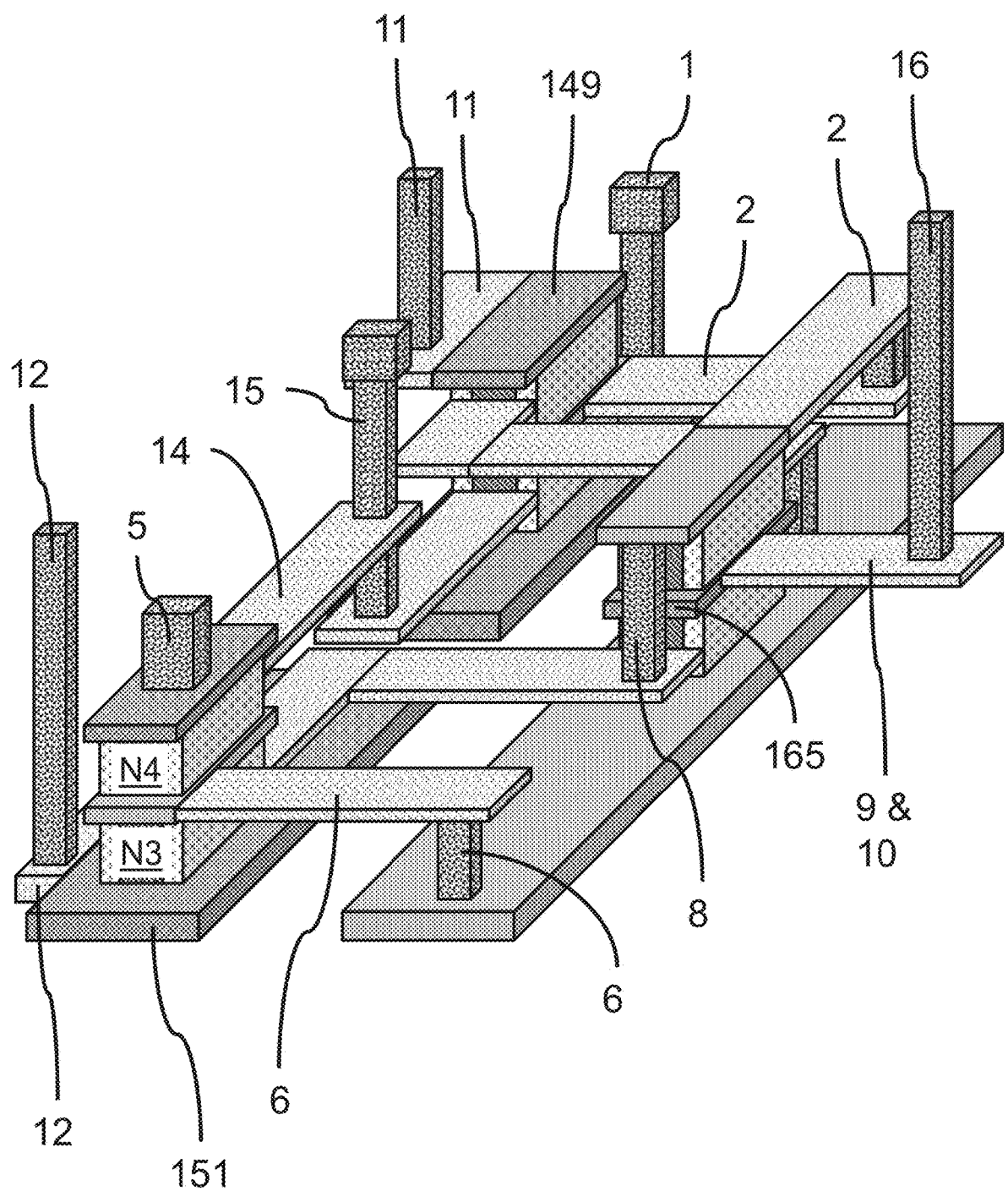
FIG. 17 is an oblique view showing fabrication of electrical connection to a middle source/drain of the PFET, in accordance with an embodiment of the present invention.

FIG. 17 is an oblique view showing fabrication of electrical connection to a middle source/drain of the PFET, in accordance with an embodiment of the present invention.

In various embodiments, a Voltage line (Vdd) 95 can be formed connecting to electrical connection(s) 9&10 through electrical connection 16, which can be a via. The Voltage line (Vdd) can be maintained at a predetermined positive or negative voltage determined by the device characteristics.

Figure 18:
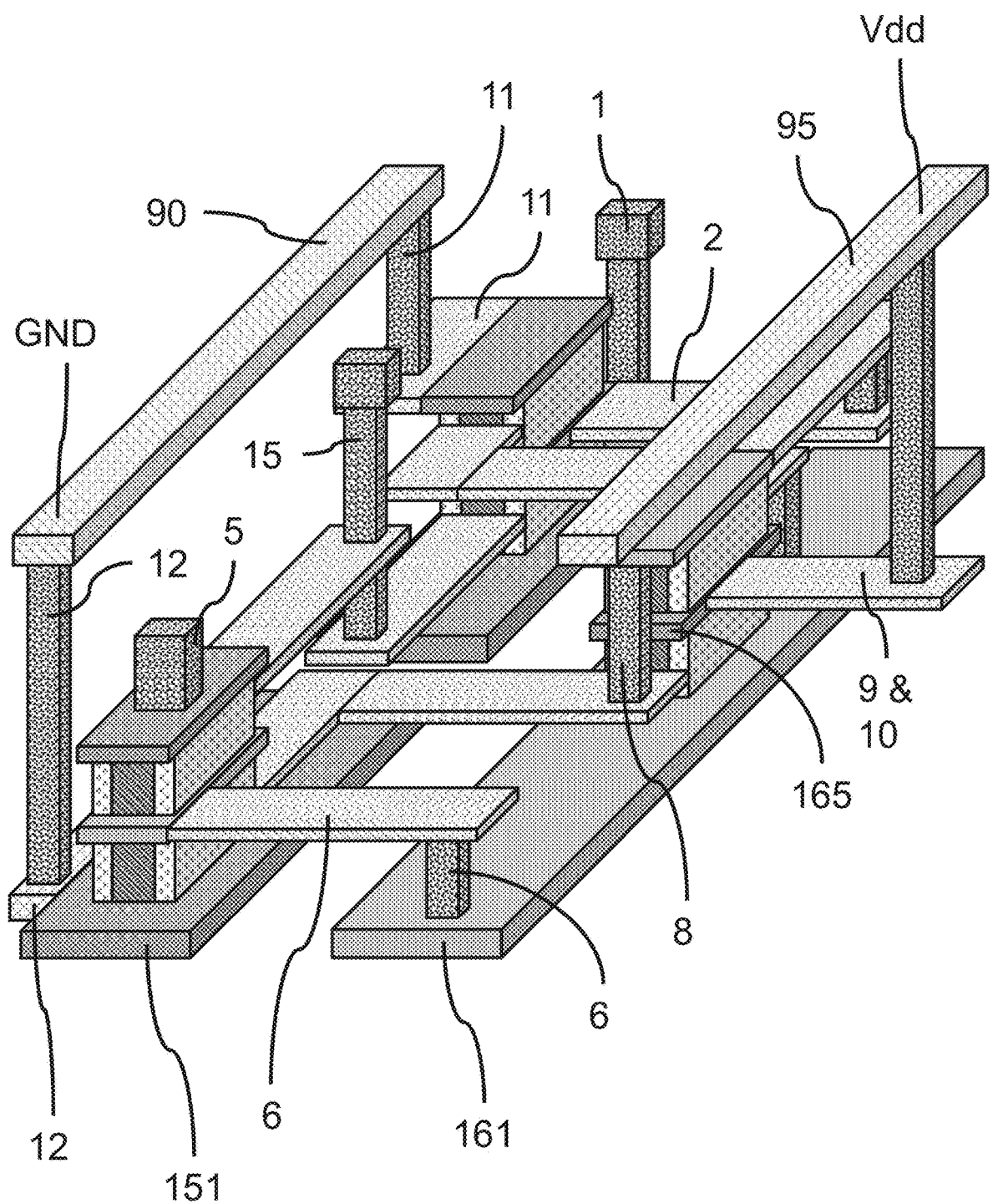
FIG. 18 is an oblique view showing fabrication of the ground (GND) and voltage (Vdd) rails for the SRAM device, in accordance with an embodiment of the present invention.

FIG. 18 is an oblique view showing fabrication of the ground (GND) and voltage (Vdd) rails for the SRAM device, in accordance with an embodiment of the present invention.

In various embodiments, a Ground line (GND) 90 can be formed connecting electrical connection 11 and electrical connection 12. The Ground line (GND) 90 can be maintained at a ground voltage.

In various embodiments, a Voltage line (Vdd) 95 can be formed connecting to electrical connection(s) 9&10 through electrical connection 16, which can be a via. The Voltage line (Vdd) can be maintained at a predetermined positive or negative voltage.

Figure 19:
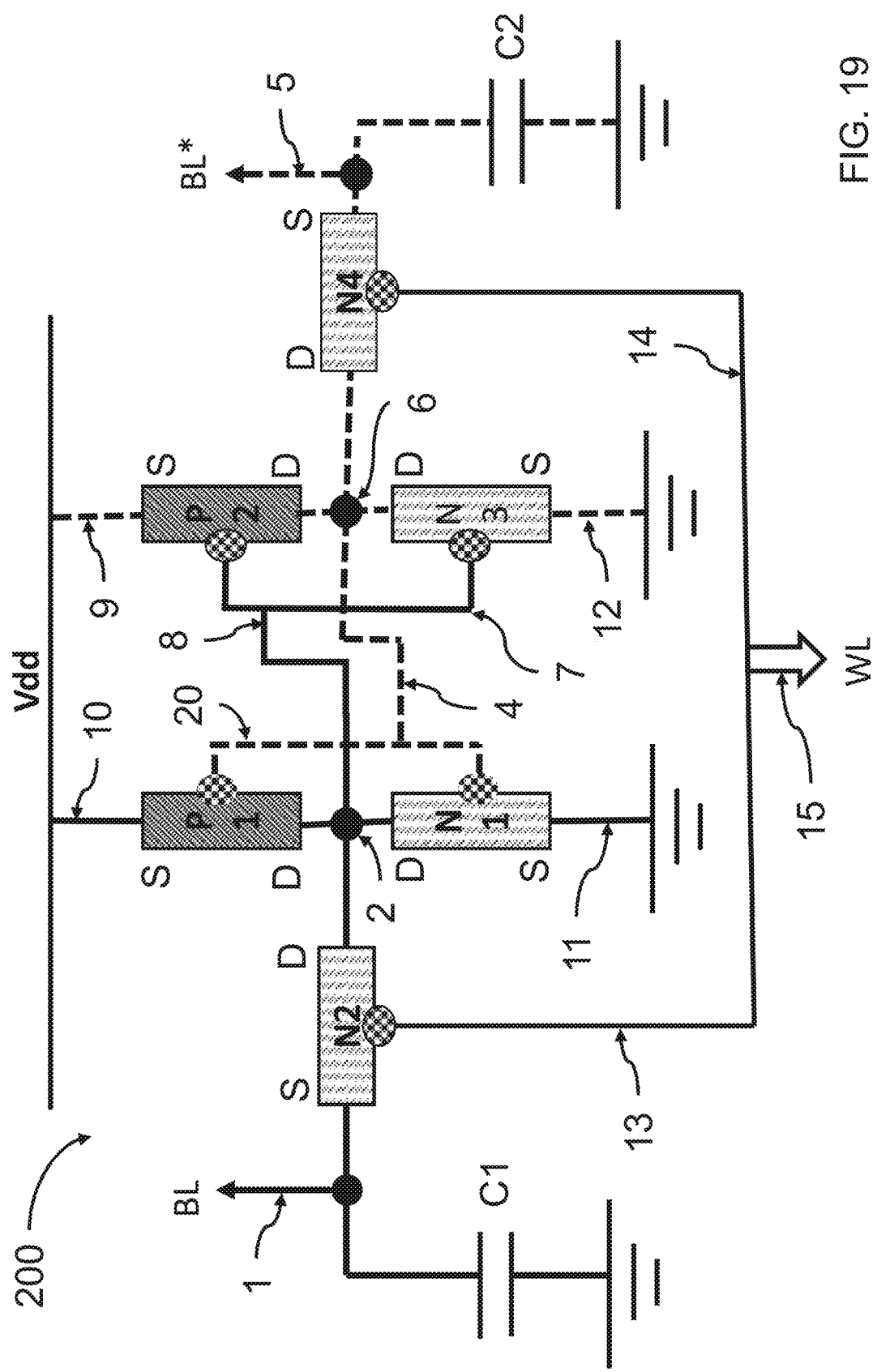
FIG. 19 is a circuit diagram showing electrical connections of the NFET and PFET stacks for an SRAM, in accordance with another embodiment of the present invention.

FIG. 19 is a circuit diagram showing electrical connections of the NFET and PFET stacks for an SRAM, in accordance with another embodiment of the present invention.

In other embodiments, the connections to lower NFET device (N1) 142 and upper NFET device (N2) 148 can be swapped, while the physical upper and lower NFET devices remain in the same position in the first fin field effect transistor device stack 140, as shown in the following figures. About a 21% improvement in area scaling can be obtained compared to a conventional VTFET utilizing the same design rule(s).

In various embodiments, the gate structure 163 (connections to gate structures have been indicated by the checkered ellipse) of a lower PFET device (P2) 162 can be electrically connected to the gate structure 153 of a lower PFET device 152 by electrical connection 7. The gate structure 163 of a lower PFET device (P2) 162 can be electrically connected to the top source/drain 169 of the upper PFET (P1) 168 by electrical connection 8, which can include a via between different levels.

In various embodiments, the gate structure 143 of lower NFET device (N1) 142 can be electrically connected to the gate structure 167 of upper PFET device (P1) 168 by electrical connection 20, where the electrical connection 20 can include a via between levels. The gate structure 143 of lower NFET device (N1) 142 and the gate structure 167 of upper PFET device (P1) 168 can be electrically connected to the bottom source/drain 161 of lower PFET device (P2) 162 by electrical connection 22, where the electrical connection 22 can include a via between levels.

In various embodiments, the gate structure 147 of upper NFET device (N2) 148 can be electrically connected to the gate structure 157 of upper NFET device (N4) 158 by electrical connection 21, where the electrical connection 21 can be at the same level as upper NFET device (N2) 148 and upper NFET device (N4) 158.

In various embodiments, the middle source/drain 145 of NFET stack 140, including lower NFET device (N1) 142 and upper NFET device (N2) 148, can be electrically connected to the top source/drain 169 of upper PFET device (P1) 168 of PFET stack 160 by electrical connection 2, which can include a via between levels. The source/drains of lower NFET device (N1) 142 and upper NFET device (N2) 148 can be interconnected with the source/drain 169 of upper PFET device (P1) 168 by electrical connection 2.

In various embodiments, the middle source/drain 155 of NFET stack 150, including lower NFET device (N3) 152 and upper NFET device (N4) 158, can be electrically connected to the bottom source/drain 161 of lower PFET device (P2) 162 of PFET stack 160 by electrical connection 6, which can include a via between levels. A Bit Line (BL) 1 can be formed to the bottom source/drain 141 of the lower NFET device (N1) 142 of the NFET stack 140.

Figure 20:
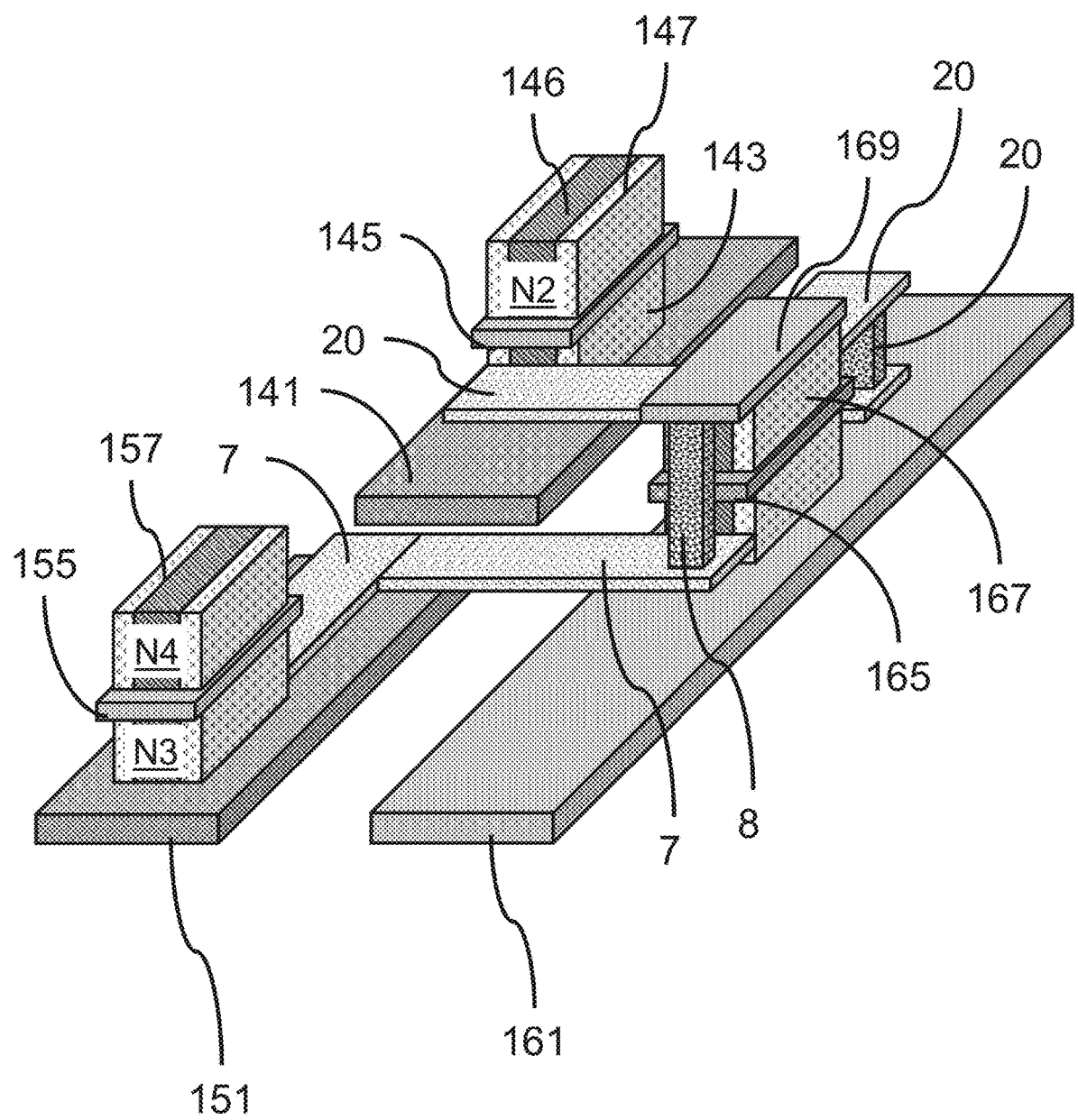
FIG. 20 is an oblique view showing fabrication of electrical connections between portions of the NFET and PFET stacks, in accordance with another embodiment of the present invention.

FIG. 20 is an oblique view showing fabrication of electrical connections between portions of the NFET and PFET stacks, in accordance with another embodiment of the present invention.

In various embodiments, the gate structure 163 (connections to gate structures have been indicated by the checkered ellipse) of a lower PFET device (P2) 162 can be electrically connected to the gate structure 153 of a lower PFET device 152 by electrical connection 7. The gate structure 163 of a lower PFET device (P2) 162 can be electrically connected to the top source/drain 169 of the upper PFET (P1) 168 by electrical connection 8, which can include a via between different levels.

In various embodiments, the gate structure 143 of lower NFET device (N1) 142 can be electrically connected to the gate structure 167 of upper PFET device (P1) 168 by electrical connection 20, where the electrical connection 20 can include a via between levels. The electrical connection 20 can have an "L" shape between two levels. The gate structure 143 of lower NFET device (N1) 142 and the gate structure 167 of upper PFET device (P1) 168 can be electrically connected to the bottom source/drain 161 of lower PFET device (P2) 162 by electrical connection 22, where the electrical connection 22 can include a via between levels.

Figure 21:
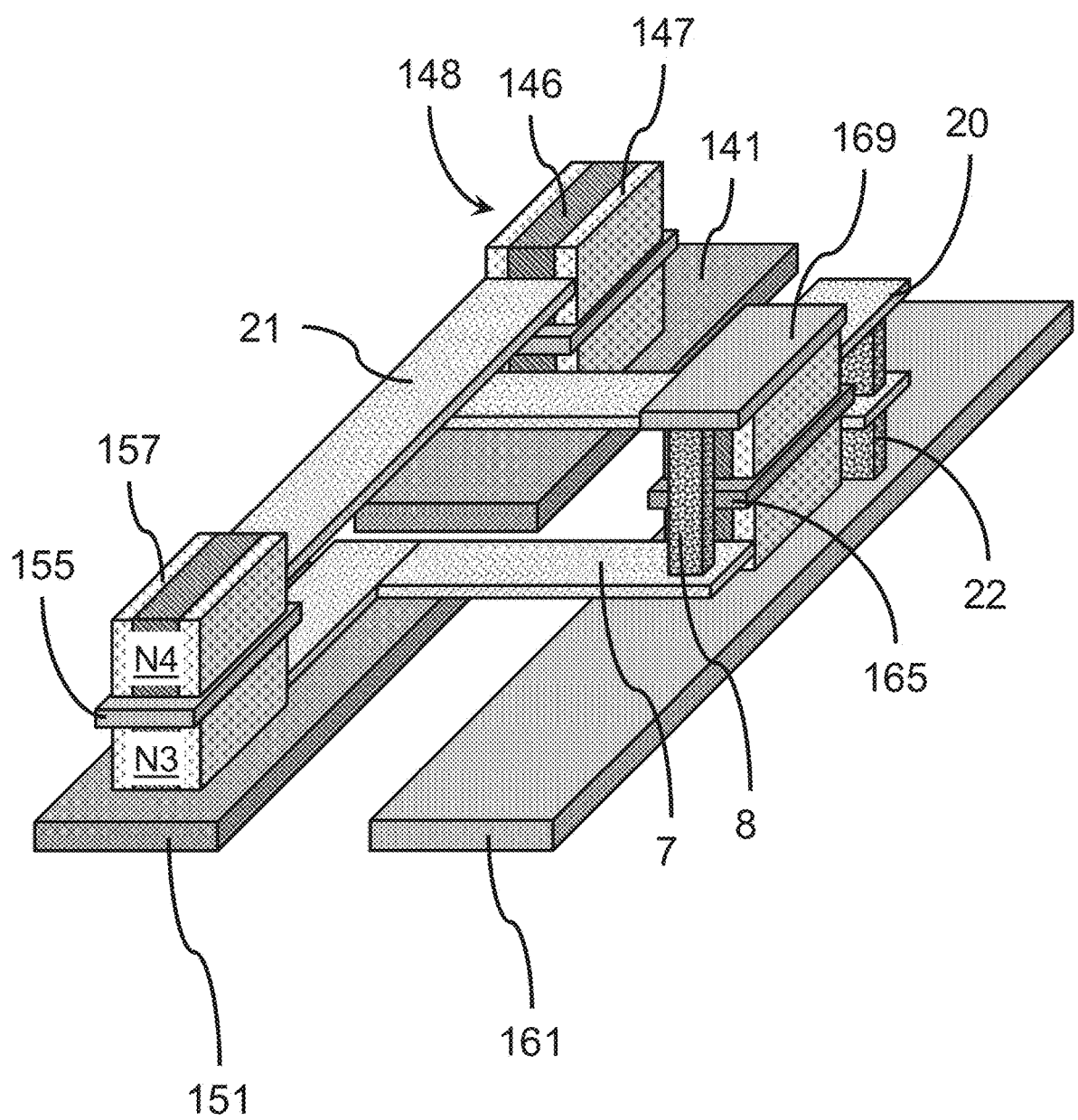
FIG. 21 is an oblique view showing fabrication of electrical connections between upper portions of the NFET stacks, in accordance with another embodiment of the present invention.

FIG. 21 is an oblique view showing fabrication of electrical connections between upper portions of the NFET stacks, in accordance with another embodiment of the present invention.

In various embodiments, the gate structure 147 of upper NFET device (N2) 148 can be electrically connected to the gate structure 157 of upper NFET device (N4) 158 by electrical connection 21, where the electrical connection 21 can be at the same level as upper NFET device (N2) 148 and upper NFET device (N4) 158. The electrical connection 21 can be a straight connection between upper NFET device (N2) 148 and upper NFET device (N4) 158.

Figure 22:
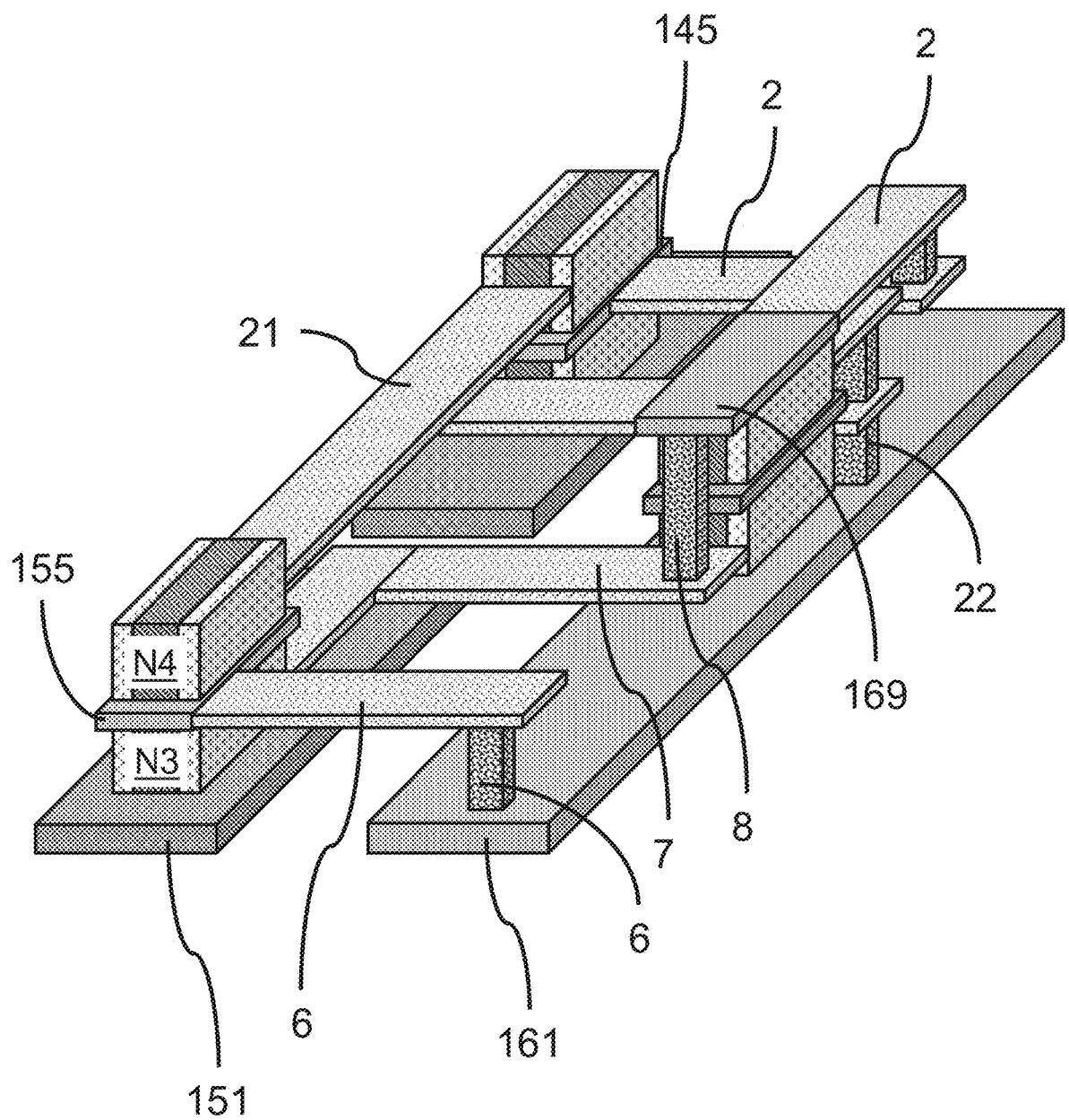
FIG. 22 is an oblique view showing fabrication of electrical connections between upper and middle portions of the NFET and PFET stacks, in accordance with another embodiment of the present invention.

FIG. 22 is an oblique view showing fabrication of electrical connections between upper and middle portions of the NFET and PFET stacks, in accordance with another embodiment of the present invention.

In various embodiments, the middle source/drain 145 of NFET stack 140, including lower NFET device (N1) 142 and upper NFET device (N2) 148, can be electrically connected to the top source/drain 169 of upper PFET device (P1) 168 of PFET stack 160 by electrical connection 2, which can include a via between levels. The source/drains of lower NFET device (N1) 142 and upper NFET device (N2) 148 can be interconnected with the source/drain 169 of upper PFET device (P1) 168 by electrical connection 2.

In various embodiments, the middle source/drain 155 of NFET stack 150, including lower NFET device (N3) 152 and upper NFET device (N4) 158, can be electrically connected to the bottom source/drain 161 of lower PFET device (P2) 162 of PFET stack 160 by electrical connection 6, which can include a via between levels. A Bit Line (BL) 1 can be formed to the bottom source/drain 141 of the lower NFET device (N1) 142 of the NFET stack 140.

Figure 23:
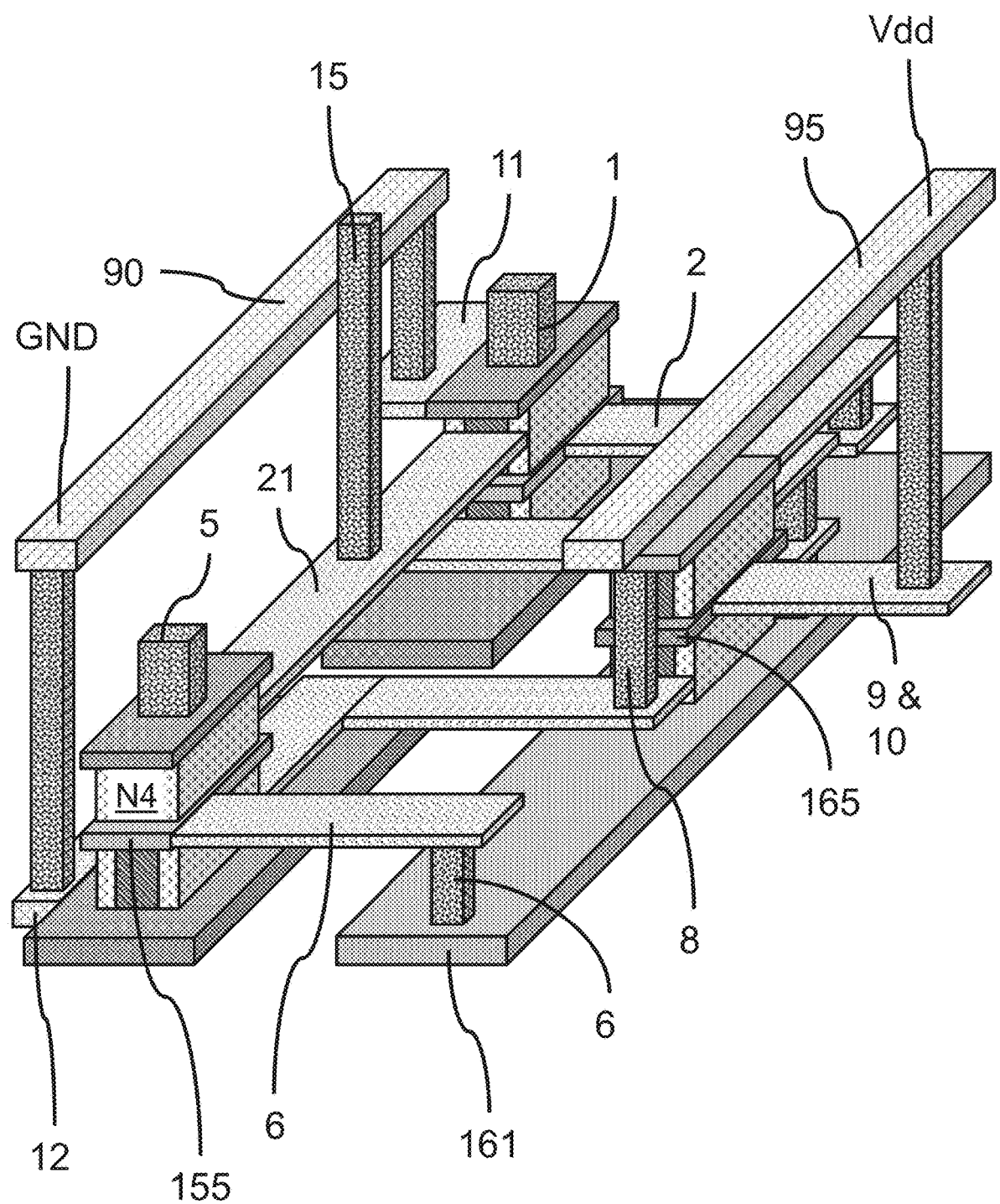
FIG. 23 is an oblique view showing fabrication of the ground (GND) and voltage (Vdd) rails for the SRAM device, in accordance with another embodiment of the present invention.

FIG. 23 is an oblique view showing fabrication of the ground (GND) and voltage (Vdd) rails for the SRAM device, in accordance with another embodiment of the present invention.

In various embodiments, an electrical connection 5 can be formed to the top source/drain 159 of the NFET stack 150. The electrical connection 5 can be a Bit Line star (BL*), which is different from Bit Line (BL) 1. Bit Line star (BL*) can connect to higher level circuitry.

In various embodiments, an electrical connection 11, can be formed to the top source/drain 149 of upper NFET (N2) 148, where electrical connection 11 can include a via.

In various embodiments, an electrical connection 15 can be formed to electrical connection 14 connecting the gate structure 143 of a lower NFET device (N1) 142 with the gate structure 157 of a upper NFET device (N4) 158. The electrical connection 15 can be a Word Line (WL). Word Line (WL) can connect to higher level circuitry.

In various embodiments, a Ground line (GND) 90 can be formed connecting electrical connection 11 and electrical connection 12, which grounds the connected components.

In various embodiments, a Voltage line (Vdd) 95 can be formed connecting to electrical connection(s) 9&10 through electrical connection 16, which can be a via. The Voltage line (Vdd) can be maintained at a predetermined positive or negative voltage.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative teams are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that layer is referred to as being "between" two layers, it can be the only layer between the two layers, or one of or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A memory device, comprising:
   a first field effect transistor (FET) stack on a first bottom source/drain region, wherein the first field effect transistor (FET) stack includes a first vertical transport fin field effect transistor (VTFET) device between a second VTFET device and the first bottom source/drain region;
   a second field effect transistor (FET) stack on a second bottom source/drain region, wherein the second field effect transistor (FET) stack includes a third VTFET device between a fourth VTFET device and the second bottom source/drain region;
   a third field effect transistor (FET) stack on a third bottom source/drain region, wherein the third field effect transistor (FET) stack includes a fifth VTFET device between a sixth VTFET device and the third bottom source/drain region, wherein the third bottom source/drain region is laterally adjacent to the first bottom source/drain region and the second bottom source/drain region;
   a first electrical connection interconnecting a gate structure of the third VTFET device with a gate structure of the fifth VTFET device; and
   a second electrical connection interconnecting a gate structure of the second VTFET device with a gate structure of the sixth VTFET device.

2. The memory device of claim 1, further comprising a first shared source/drain region between the first VTFET device and the second VTFET device; a second shared source/drain region between the third VTFET device and the fourth VTFET device; and a third shared source/drain region between the fifth VTFET device and the sixth VTFET device.

3. The memory device of claim 2, further comprising a third electrical connection interconnecting the second shared source/drain region and the third bottom source/drain region.

4. The memory device of claim 3, further comprising a fourth electrical connection interconnecting the first shared source/drain region and a top source/drain region on the sixth VTFET device.

5. The memory device of claim 4, further comprising a fifth electrical connection interconnecting a gate structure of the first VTFET device with a gate structure of the fourth VTFET device, and a word line electrically connected to the fifth electrical connection.

6. The memory device of claim 5, further comprising a bit line electrically connected to the first bottom source/drain region.

7. The memory device of claim 6, further comprising a sixth electrical connection in electrical contact with the third shared source/drain region.

8. The memory device of claim 7, wherein the first VTFET device, second VTFET device, third VTFET device, and fourth VTFET device are each n-type VTFET devices, and the fifth VTFET device and sixth VTFET device are each p-type VTFET devices.

9. The memory device of claim 8, wherein the first shared source/drain region and the second shared source/drain region are each configured as drains, and the third shared source/drain region is configured as a source.

10. A memory device, comprising:
    a first field effect transistor (FET) stack on a first bottom source/drain region, wherein the first field effect transistor (FET) stack includes a first vertical transport fin field effect transistor (VTFET) device between a second VTFET device and the first bottom source/drain region;
    a second field effect transistor (FET) stack on a second bottom source/drain region, wherein the second field effect transistor (FET) stack includes a third VTFET device between a fourth VTFET device and the second bottom source/drain region, wherein the second bottom source/drain region is aligned with the first bottom source/drain region along a long axis;
    a third field effect transistor (FET) stack on a third bottom source/drain region, wherein the third field effect transistor (FET) stack includes a fifth VTFET device between a sixth VTFET device and the third bottom source/drain region, wherein the third bottom source/drain region is laterally adjacent to the first bottom source/drain region and the second bottom source/drain region, and the third field effect transistor (FET) stack is positioned between the first field effect transistor (FET) stack and second field effect transistor (FET) stack;
    a first electrical connection interconnecting a gate structure of the third VTFET device with a gate structure of the fifth VTFET device; and
    a second electrical connection interconnecting a gate structure of the second VTFET device with a gate structure of the sixth VTFET device.

11. The memory device of claim 10, wherein the first VTFET device, second VTFET device, third VTFET device, and fourth VTFET device are each n-type VTFET devices, and the fifth VTFET device and sixth VTFET device are each p-type VTFET devices.

12. The memory device of claim 11, wherein the first shared source/drain region and the second shared source/drain region are each configured as drains, and the third shared source/drain region is configured as a source.

13. The memory device of claim 12, further comprising a third electrical connection interconnecting a gate structure of the second VTFET device with a gate structure of the fourth VTFET device.

14. The memory device of claim 13, further comprising a word line electrically connected to the third electrical connection.

15. The memory device of claim 14, further comprising a ground electrically connected to the first bottom source/drain region and the second bottom source/drain region.

16. A memory device, comprising:
    a first field effect transistor (FET) stack on a first bottom source/drain region, wherein the first field effect transistor (FET) stack includes a first vertical transport fin field effect transistor (VTFET) device between a second VTFET device and the first bottom source/drain region;
    a second field effect transistor (FET) stack on a second bottom source/drain region, wherein the second field effect transistor (FET) stack includes a third VTFET device between a fourth VTFET device and the second bottom source/drain region, wherein the second bottom source/drain region is aligned with the first bottom source/drain region along a long axis;
    a third field effect transistor (FET) stack on a third bottom source/drain region, wherein the third field effect transistor (FET) stack includes a fifth VTFET device between a sixth VTFET device and the third bottom source/drain region, wherein the third bottom source/drain region is laterally adjacent to the first bottom source/drain region and the second bottom source/drain region, and the third field effect transistor (FET) stack is positioned between the first field effect transistor (FET) stack and second field effect transistor (FET) stack;
a first electrical connection interconnecting a gate structure of the third VTFET device with a gate structure of the fifth VTFET device;
a second electrical connection interconnecting a gate structure of the second VTFET device with a gate structure of the sixth VTFET device; and
a ground electrically connected to the first bottom source/drain region and the second bottom source/drain region.

17. The memory device of claim 16, further comprising a first shared source/drain region between the first VTFET device and the second VTFET device; a second shared source/drain region between the third VTFET device and the fourth VTFET device; and a third shared source/drain region between the fifth VTFET device and the sixth VTFET device.

18. The memory device of claim 17, wherein the first VTFET device, second VTFET device, third VTFET device, and fourth VTFET device are each n-type VTFET devices, and the fifth VTFET device and sixth VTFET device are each p-type VTFET devices.

19. The memory device of claim 18, further comprising a sixth electrical connection in electrical contact with the third shared source/drain region and electrically connected to a power rail, wherein the power rail is parallel to a long axis of the third field effect transistor (FET) stack.

20. The memory device of claim 19, wherein the first shared source/drain region and the second shared source/drain region are each configured as drains, and the third shared source/drain region is configured as a source.

\* \* \* \* \*